United States Patent
Tobise et al.

(10) Patent No.: US 9,373,818 B2
(45) Date of Patent: Jun. 21, 2016

(54) ORGANIC ELECTROLUMINESCENT ELEMENT

(71) Applicant: UDC IRELAND LIMITED, Dublin (IE)

(72) Inventors: Manabu Tobise, Kanagawa (JP); Yuichiro Itai, Kanagwa (JP); Kana Morohashi, Kanagawa (JP); Shin'ichiro Sonoda, Kanagawa (JP); Jingbo Li, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 0 days.

(21) Appl. No.: 13/897,652

(22) Filed: May 20, 2013

(65) Prior Publication Data

US 2013/0334506 A1    Dec. 19, 2013

(30) Foreign Application Priority Data

May 30, 2012    (JP) ................................. 2012-123189

(51) Int. Cl.
*H01L 51/52*    (2006.01)

(52) U.S. Cl.
CPC ........ *H01L 51/5268* (2013.01); *H01L 51/5206* (2013.01); *H01L 51/5212* (2013.01); *H01L 51/5215* (2013.01); *H01L 51/5234* (2013.01); *H01L 51/5275* (2013.01); *H01L 2251/5369* (2013.01)

(58) Field of Classification Search
CPC ............ H01L 51/5268; H01L 51/5237; H01L 51/5284; H01L 51/5275; H01L 51/52; H01L 51/5203; H01L 51/5262; H01L 51/5012
See application file for complete search history.

(56) References Cited

U.S. PATENT DOCUMENTS

| | | | |
|---|---|---|---|
| 6,608,449 B2 | 8/2003 | Fukunaga | |
| 6,847,057 B1 | 1/2005 | Gardner et al. | |
| 7,759,861 B2 | 7/2010 | Fujimoto et al. | |
| 7,910,941 B2 | 3/2011 | Chen et al. | |
| 2005/0007000 A1 | 1/2005 | Chou et al. | |
| 2005/0142379 A1 | 6/2005 | Juni et al. | |
| 2005/0194896 A1 | 9/2005 | Sugita et al. | |
| 2006/0043362 A1 | 3/2006 | Ishikawa et al. | |
| 2006/0049745 A1* | 3/2006 | Handa et al. .................. | 313/503 |

(Continued)

FOREIGN PATENT DOCUMENTS

| | | |
|---|---|---|
| EP | 1603367 | 12/2005 |
| JP | 2001-330712 | 11/2001 |

(Continued)

*Primary Examiner* — Whitney T Moore
(74) *Attorney, Agent, or Firm* — Riverside Law LLP

(57) ABSTRACT

It is an object of the present invention to provide an organic electroluminescent element with which no light extraction layer needs to be produced separately, which has a transparent electrode that is advantageous in terms of cost and can be formed by a simple film formation process, and which is excellent from the standpoint of light extraction efficiency. The present invention provides an organic electroluminescent element in which a substrate, a first electrode adjacent to this substrate, an organic layer including at least one organic light-emitting layer, and a second electrode adjacent to this organic layer are formed in this order, with this organic electroluminescent element being such that at least one of the aforementioned electrodes is a transparent electrode which is transparent, which contains at least one type of light scattering particles that are transparent and that have a primary particle size of at least 0.5 μm, and which is composed of the aforementioned light scattering particles and a component having a refractive index equal to or higher than the refractive index of the aforementioned organic light-emitting layer.

13 Claims, 5 Drawing Sheets

(56) References Cited

U.S. PATENT DOCUMENTS

| | | |
|---|---|---|
| 2006/0125388 A1 | 6/2006 | Song et al. |
| 2006/0244371 A1* | 11/2006 | Cok et al. ............... 313/506 |
| 2007/0063641 A1 | 3/2007 | Cok et al. |
| 2007/0126352 A1 | 6/2007 | Okutani |
| 2007/0126358 A1 | 6/2007 | Okutani et al. |
| 2007/0284601 A1 | 12/2007 | Khanarian |
| 2008/0176041 A1 | 7/2008 | Sato et al. |
| 2009/0057700 A1 | 3/2009 | Jin et al. |
| 2009/0140276 A1 | 6/2009 | Kuratate |

FOREIGN PATENT DOCUMENTS

| | | |
|---|---|---|
| JP | 2002-270365 | 9/2002 |
| JP | 2004-014385 | 1/2004 |
| JP | 2004-296429 | 10/2004 |
| JP | 2005-070318 | 3/2005 |
| JP | 2005-190931 | 7/2005 |
| JP | 2005-251488 | 9/2005 |
| JP | 2005-275214 | 10/2005 |
| JP | 2006-054197 | 2/2006 |
| JP | 2006-066263 | 3/2006 |
| JP | 2006-085985 | 3/2006 |
| JP | 2006-107744 | 4/2006 |
| JP | 2006-184587 | 7/2006 |
| JP | 2012-009359 | 1/2012 |
| WO | 03/026357 | 3/2003 |
| WO | 2006/035625 | 4/2006 |
| WO | 2006/095612 | 9/2006 |
| WO | 2007/038070 | 4/2007 |

* cited by examiner

ORGANIC ELECTROLUMINESCENT ELEMENT

CROSS-REFERENCE TO RELATED APPLICATIONS

The present U.S. patent application claims priority benefit from Japanese Patent Appl. No. 2012-123189, filed 30 May 2012, which is incorporated by reference herein in its entirety.

TECHNICAL FIELD

The present invention relates to an organic electroluminescent element characterized in that at least one electrode is transparent, has a refractive index equal to or higher than the refractive index of an organic light-emitting layer, and contains at least one type of light scattering particles.

BACKGROUND ART

An organic electroluminescent element is a self-emitting type of light-emitting device that has, on a substrate, a pair of electrodes comprising an anode and a cathode and an organic layer including a light-emitting layer between this pair of electrodes, and [these elements] are expected to find use in a variety of applications, such as displays and lighting.

In order for the light generated by the light-emitting layer to be taken off, at least one of the anode and the cathode of the organic electroluminescent element needs to be an electrode having light transmission properties. Indium tin oxide (ITO) is commonly used as an electrode having light transmission properties.

Aiming at accomplishing both extraction of light at a high efficiency and improvement of electrical characteristics, an organic electroluminescent element has been proposed which has an electrode in which a first transparent conductive layer composed of a binder and conductive nanoparticles and a second transparent conductive layer composed of a conductive polymer are formed in that order on a substrate surface (Patent Document 1).

Furthermore, aiming at an increase in the surface-emission luminance of an organic electroluminescent element, an organic electroluminescent element featuring a substrate laminated with a scattering layer has been proposed (Patent Document 2).

RELATED ART DOCUMENTS

Patent Documents

Patent Document 1: Japanese Laid-Open Patent Application 2012-009359

Patent Document 2: WO 03/026357

SUMMARY OF THE INVENTION

Problems to be Solved by the Invention

However, the conductive nanoparticles used in Patent Document 1 are small in size, and there is no mention of adding micron-order particles to the electrode.

Moreover, with the scattering layer described in Patent Document 2, the refractive index is not taken into account at all, so there is a problem in that light extraction efficiency cannot be expected to be improved.

It is an object of the present invention to solve the aforementioned problems encountered in the past and to achieve the following goal:

Specifically, it is an object of the present invention to provide an organic electroluminescent element with which no light extraction layer needs to be produced separately and which has a transparent electrode [that can be formed by] a simple film formation process and that is advantageous in terms of cost. It is also an object of the present invention to provide an organic electroluminescent element with which the refractive index of the transparent electrode is adjusted higher than that of the organic light-emitting layer and which contains light scattering particles and is excellent from the standpoint of light extraction efficiency.

Means for Solving the Problems

The present inventors conducted diligent investigation aimed at solving the aforementioned problems, and [as a result] discovered an organic electroluminescent element in which a substrate, a first electrode adjacent to this substrate, an organic layer including at least one organic light-emitting layer, and a second electrode adjacent to this organic layer are formed in this order, wherein at least one of the aforementioned electrodes is a transparent electrode which is transparent, which contains at least one type of light scattering particles that are transparent and have a primary particle size of at least 0.5 μm, and which is composed of the aforementioned light scattering particles and a component having a refractive index equal to or higher than the refractive index of the aforementioned organic light-emitting layer. It was discovered that the light extraction efficiency can be improved considerably by employing an organic electroluminescent element having this configuration.

Specifically, the means for solving the aforementioned problems are as follows: Note that in this Specification, [the phrase] "x to y" indicates a range that includes the numerical values given for "x" and "y" as the minimum and maximum values, respectively.

(1)

An organic electroluminescent element in which a substrate, a first electrode adjacent to the substrate, an organic layer including at least one organic light-emitting layer, and a second electrode adjacent to the organic layer are formed in this order, wherein at least one of the electrodes is a transparent electrode which is transparent, which contains at least one type of light scattering particles that are transparent and have a primary particle size of at least 0.5 μm, and which is composed of the light scattering particles and a component having a refractive index equal to or higher than the refractive index of the organic light-emitting layer.

(2)

The organic electroluminescent element according to (1), wherein the component having a refractive index equal to or higher than the refractive index of the organic light-emitting layer contains particles with a primary particle size of 100 nm or less.

(3)

The organic electroluminescent element according to (2), wherein the refractive index of the particles whose primary particle size is 100 nm or less is at least 2.0 and no more than 3.0.

(4)

The organic electroluminescent element according to any one of (1) to (3), wherein the component having a refractive index equal to or higher than the refractive index of the organic light-emitting layer contains a conductive matrix.

(5)

The organic electroluminescent element according to (4), wherein the component having a refractive index equal to or higher than the refractive index of the organic light-emitting layer contains a conductive matrix and particles whose primary particle size is 100 nm or less, and the refractive index of the particles whose primary particle size is 100 nm or less is higher than the refractive index of the conductive matrix.

(6)

The organic electroluminescent element according to any one of (1) to (5), wherein the refractive index of the component having a refractive index equal to or higher than the refractive index of the organic light-emitting layer is at least 1.7 and no more than 2.2.

(7)

The organic electroluminescent element according to any one of (1) to (6), wherein the primary particle size of the light scattering particles is at least 0.5 µm and no more than 10 µm.

(8)

The organic electroluminescent element according to any one of (1) to (7), wherein the refractive index of the light scattering particles is lower than the refractive index of the component having a refractive index equal to or higher than the refractive index of the organic light-emitting layer.

(9)

An organic electroluminescent element in which a substrate, a first electrode adjacent to the substrate, an organic layer including at least one organic light-emitting layer, and a second electrode adjacent to the organic layer are formed in this order, wherein at least one of the electrodes is a transparent electrode configured from two layers, the two layers both contain a conductive matrix, and one of the two layers contains at least one type of light scattering particles that are transparent and have a primary particle size of at least 0.5 µm and is composed of the light scattering particles and a component having a refractive index equal to or higher than the refractive index of the organic light-emitting layer, and the other layer does not contain light scattering particles and has a refractive index that is equal to or higher than the refractive index of the organic light-emitting layer.

(10)

The organic electroluminescent element according to (9), wherein of the two layers, the layer that does not contain light scattering particles is adjacent to the organic layer.

(11)

The organic electroluminescent element according to any one of (1) to (10), wherein either the first electrode or the second electrode is a transparent electrode, and the other electrode is a metal electrode.

(12)

The organic electroluminescent element according to any one of (1) to (11), wherein the first electrode is a transparent electrode.

(13)

The organic electroluminescent element according to any one of (1) to (12), wherein wiring whose resistance is lower than that of the first electrode is provided between the first electrode and the substrate, and the first electrode covers the wiring.

Effects of the Invention

With the present invention, it is possible to provide an organic electroluminescent element with which no light extraction layer needs to be produced separately and which has a transparent electrode that is advantageous in terms of cost and [can be formed by] a simple film formation process. It is also possible to provide an organic electroluminescent element with which the refractive index of the aforementioned transparent electrode is adjusted higher than that of the organic light-emitting layer and which is excellent from the standpoint of light extraction efficiency.

DETAILED DESCRIPTION OF EMBODIMENTS

Figure 1:
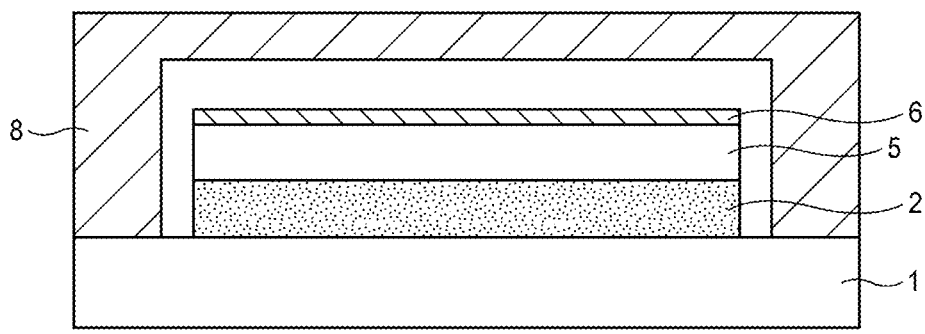
FIG. 1 is a schematic diagram showing the organic electroluminescent elements in Working Example 1, Working Example 4, and Comparative Example 2.

The organic electroluminescent element of the present invention is an organic electroluminescent element in which a substrate, a first electrode adjacent to this substrate, an organic layer including at least one organic light-emitting layer, and a second electrode adjacent to this organic layer are formed in this order, with at least one of the aforementioned electrodes including a transparent electrode which is transparent, which contains at least one type of light scattering particles that are transparent and have a primary particle size of at least 0.5 µm, and which is composed of the aforementioned light scattering particles and a component having a refractive index equal to or higher than the refractive index of the aforementioned organic light-emitting layer.

(Electrodes)

At least one of the first electrode and second electrode of the present invention is a transparent electrode (hereinafter also referred to as a "conductive layer" or a "coating-type diffused conductive layer") which is transparent, which contains at least one type of light scattering particles that are transparent and have a primary particle size of at least 0.5 µm, and which is composed of the aforementioned light scattering particles and a component having a refractive index equal to or higher than the refractive index of the aforementioned organic light-emitting layer.

There are no particular restrictions on the conductive layer included in the organic electroluminescent element of the present invention as long as it is transparent and composed of the aforementioned light scattering particles and a component having a refractive index that is equal to or higher than the refractive index of the aforementioned organic light-emitting layer, and it can be formed by light scattering particles and a conductive matrix, for example.

Here, the primary particle size of the light scattering particles in this Specification is a primary particle size [found by] dispersing 1 g of light scattering particles in 200 g of methanol, measuring the size of the light scattering particles using a "Multisizer II" precision particle size distribution measurement device made by Peckman Coulter [sic][1], and calculating so as to obtain an average particle size by volumetric standard.

[1]Translator's note: "Peckman Coulter" is likely a typological error in the original for "Beckman Coulter."

Furthermore, saying that the conductive layer is transparent means that the absorbency ($A(\lambda)$) found using the following equation from the amount of incident light ($I_0$) and the total value of the amount of transmitted light ($I_T$) including the transmitted and scattered component and the amount of reflected light ($I_R$) including the scattered and reflected light, in the visible light region, and particularly over the range of wavelengths of 450 to 750 nm, is 1 or less.

$$A(\lambda) = -\log_{10}\{(I_T + I_R)/I_0\}$$

The "transparent conductive layer" in the present invention also encompasses, for example, inorganic conductive oxide materials such as ITO or conductive polymer materials such as PEDOT-PSS.

From the standpoint of a balance between optical transmissivity and resistance, the thickness of the conductive layer is preferably at least 100 nm and no more than 10 μm, more preferably at least 100 nm and no more than 7 μm, and even more preferably at least 100 nm and no more than 5 μm.

The average thickness of the conductive layer can be found, for example, by cutting out part of the conductive layer and measuring it with a scanning electron microscope (S-3400N, made by Hitachi High-Technologies Corporation).

(Light Scattering Particles)

There are no particular restrictions on the light scattering particles as long as the primary particle size is at least 0.5 μm, and the particles are capable of scattering or diffusing light. [The particles] can be suitably selected according to their intended use and may be either organic or inorganic particles, and two or more types of particle may be contained.

Examples of the aforementioned organic particles include polymethyl methacrylate particles, crosslinked polymethyl methacrylate particles, acrylic-styrene copolymer particles, melamine particles, polycarbonate particles, polystyrene particles, crosslinked polystyrene particles, polyvinyl chloride particles, and benzoguanamine-melamine formaldehyde particles.

Examples of the aforementioned inorganic particles include $ZrO_2$, $TiO_2$, $Al_2O_3$, $In_2O_3$, ZnO, $SnO_2$, and $Sb_2O_3$. Of these, $TiO_2$, $ZrO_2$, ZnO, and $SnO_2$ are particularly favorable.

Of these, in terms of dispersibility in a binder and solvent resistance, the aforementioned light scattering particles are preferably resin particles in a crosslinked state, with crosslinked polymethyl methacrylate particles being particularly favorable.

It can be confirmed that the aforementioned light scattering particles are resin particles in a crosslinked state by dispersing the resin particles in a solvent, e.g., toluene, and checking to see how difficult it is for them to dissolve.

There are no particular restrictions on the refractive index of the light scattering particles, which can be suitably selected according to the intended use, but it is preferably at least 1.0 and no more than 3.0, more preferably at least 1.2 and no more than 2.0, and even more preferably at least 1.3 and no more than 1.7. If the aforementioned refractive index is at least 1.0 and no more than 3.0, light diffusion (scattering) will not be excessive, so the light extraction efficiency will tend to be better.

Moreover, the refractive index of the light scattering particles is preferably lower than the refractive index of the component having a refractive index equal to or higher than the refractive index of the aforementioned organic light-emitting layer.

Note that, in this Specification, "the refractive index of the component having a refractive index equal to or higher than the refractive index of the aforementioned organic light-emitting layer" refers to the refractive index of the product of removing the light scattering particles from the entire component constituting the conductive layer (refractive index control particles, conductive matrix, etc.).

The reason for removing the refractive index of the light scattering particles in evaluating the refractive index of the conductive layer is that the light scattering particles are sufficiently larger than the wavelength of the light, and the refractive index of the light scattering particles has almost no effect on changes in the light extraction efficiency attributable to the relationship between the magnitude of the refractive index of the organic light-emitting layer and the magnitude of the refractive index of the conductive layer. The aforementioned "refractive index of the component having a refractive index equal to or higher than the refractive index of the organic light-emitting layer" will hereinafter also be referred to simply as "the refractive index of the conductive layer" in some instances.

The refractive index of the conductive layer was measured by forming, on a silicon substrate or a quartz substrate, a film of the component having a refractive index equal to or higher than the refractive index of the aforementioned organic light-emitting layer in a thickness approximately corresponding to the wavelength of the light and measuring the refractive index of the film thus formed on the substrate with an ellipsometer.

In addition, the refractive index of the light scattering particles in this Specification is a refractive index which was measured by an ellipsometer used for measuring a refractive index for the aforementioned conductive layer obtained by using the raw material of the aforementioned light scattering particles to form a film on a silicon substrate in a thickness approximately corresponding to the wavelength of the light source of the aforementioned ellipsometer. The refractive index of the particles with a primary particle size of 100 nm or less (described later) is also measured in the same manner.

The primary particle size of the aforementioned light scattering particles is preferably at least 0.5 μm and no more than 10 μm, more preferably at least 0.5 μm and no more than 6 μm, and even more preferably at least 1 μm and no more than 3 μm. If the primary particle size of the aforementioned light scattering particles is 10 μm or less, light will tend not to be scattered forward, so the light scattering particles will tend not to decrease the ability to change the angle of the light.

On the other hand, if the primary particle size of the aforementioned light scattering particles is less than 0.5 μm, they will be smaller than the wavelength of visible light, and Mie scattering will change to the region of Rayleigh scattering. Consequently, the wavelength dependence of scattering efficiency of the light scattering particles will increase, and the chromaticity of the organic electroluminescent device will be prone to changing, which is undesirable. This is also undesirable in that rearward scattering will be so strong that light extraction efficiency will end up decreasing.

The amount in which the light scattering particles are contained in the conductive layer is preferably at least 30 vol % and no more than 66 vol %, more preferably at least 30 vol % and no more than 60 vol %, and even more preferably at least 30 vol % and no more than 55 vol %. If the aforementioned amount is at least 30 vol %, there will be a higher probability that light incident on the conductive layer will be scattered by the light scattering particles, and the ability to change the light angle of the conductive layer will be greater, so light extraction efficiency will increase even though the thickness of the conductive layer is not increased. This is also linked to a decrease in cost since the thickness of the aforementioned conductive layer need not be increased, and there will be less variance in the thickness of the conductive layer, making it less likely that there will be variance in the scattering effect within the light emission face. On the other hand, if the aforementioned amount is 66 vol % or less, the surface of the aforementioned conductive layer will not be too rough, and voids will tend not to be produced internally, so there is less likely to be a decrease in the physical strength of the aforementioned conductive layer.

From the standpoint of light extraction efficiency, the conductive layer preferably includes the aforementioned resin particles and titanium oxide microparticles that have undergone photocatalytic deactivation processing. Concrete examples and the preferable range of these titanium oxide microparticles that have undergone photocatalytic deactivation processing are the same as those described for the aforementioned conductive layer.

(Component Having a Refractive Index Equal to or Higher than the Refractive Index of the Organic Light-emitting Layer)

The conductive layer of the present invention contains a component having a refractive index equal to or higher than the refractive index of the organic light-emitting layer.

The "component having a refractive index equal to or higher than the refractive index of the organic light-emitting layer" is defined as being a component obtained by removing light scattering particles from the component contained in the conductive layer. Furthermore, when the conductive layer is configured from two layers, the component having a refractive index equal to or higher than the refractive index of the organic light-emitting layer is defined as being, in one of the aforementioned two layers that contains light scattering particles, a component obtained by removing light scattering particles from the component contained in this one layer.

The component having a refractive index equal to or higher than the refractive index of the organic light-emitting layer may be made up of just one component, or may be made up of two or more components.

The component having a refractive index equal to or higher than the refractive index of the organic light-emitting layer preferably contains a conductive matrix and particles with a primary particle size of 100 nm or less (described later).

For example, when the conductive layer contains light scattering particles, a conductive matrix, and particles with a primary particle size of 100 nm or less, the component having a refractive index equal to or higher than the refractive index of the organic light-emitting layer refers to a component composed of the aforementioned conductive matrix and the aforementioned particles with a primary particle size of 100 nm or less. Moreover, in a conductive layer configured from two layers, if one of the aforementioned two layers contains light scattering particles, a conductive matrix, and particles with a primary particle size of 100 nm or less, for example, the component having a refractive index equal to or higher than the refractive index of the organic light-emitting layer refers to a component composed of the aforementioned conductive matrix and the aforementioned particles with a primary particle size of 100 nm or less.

(Particles with a Primary Particle Size of 100 nm or Less)

In the present invention, the component having a refractive index equal to or higher than the refractive index of the organic light-emitting layer can contain particles with a primary particle size of 100 nm or less (hereinafter also referred to as "nano-sized particles" or "refractive index control particles").

The primary particle size of the nano-sized particles in this Specification is defined as being a primary particle size obtained by measuring the size of nano-sized particles using a "Delsa™ Nano C" made by Peckman Coulter [sic][2] and performing calculation so as to obtain an average particle size by volumetric standard.

[2]Translator's note: "Peckman Coulter" is likely a typological error in the original for "Beckman Coulter."

—Nano-sized Particles Having Refractive Index Greater than that of Conductive Matrix—

The aforementioned nano-sized particles preferably have a refractive index that is higher (greater) than that of the conductive matrix (described later).

The nano-sized particles that have a refractive index greater than that of the conductive matrix are preferably inorganic microparticles, and are preferably metal oxide microparticles such as microparticles of an oxide of aluminum, titanium, zirconium, or antimony, and from the standpoint of refractive index, titanium oxide microparticles are particularly favorable. The titanium oxide microparticles are preferably ones that have undergone processing to deactivate a photocatalytic effect.

—Titanium Oxide Microparticles that have Undergone Photocatalytic Deactivation Processing—

There are no particular restrictions on the titanium oxide microparticles that have undergone photocatalytic deactivation processing as long as there is no photocatalytic activity, and [these particles] can be suitably selected according to their intended use, but examples include (1) titanium oxide microparticles whose surface has been covered with at least one of alumina, silica, and zirconia, and (2) titanium oxide microparticles produced by using a resin to cover the covered surface of the titanium oxide microparticles obtained as in (1) above. Examples of this resin include polymethyl methacrylate (PMMA).

It can be confirmed that the aforementioned titanium oxide microparticles that have undergone photocatalytic deactivation processing have no photocatalytic activity by a methylene blue method, for example.

There are no particular restrictions on the titanium oxide microparticles used in the aforementioned titanium oxide microparticles that have undergone photocatalytic deactivation processing, which can be suitably selected according to their intended use, but the aforementioned crystal structure is preferably one in which rutile, a rutile/anatase mixed crystal, or anatase is the main component, and a rutile structure is particularly favorable as the main component.

The aforementioned titanium oxide microparticles may be compounded by adding a metal oxide other than titanium oxide.

The metal oxide that can be compounded with the aforementioned titanium oxide microparticles is preferably at least one type of metal oxide selected from among tin, zirconium, silicon, zinc, and aluminum.

The amount in which the aforementioned metal oxide is added to titanium is preferably 1 to 40 mol %, more preferably 2 to 35 mol %, and even more preferably 3 to 30 mol %.

The primary particle size of the nano-sized particles having a refractive index greater than that of the conductive matrix is preferably at least 1 nm and no more than 100 nm, more preferably at least 1 nm and no more than 30 nm, particularly preferably at least 1 nm and no more than 25 nm, and most preferably at least 1 nm and no more than 20 nm. It is preferable for the primary particle size to be 100 nm or less because the dispersion will tend not to be turbid, and settling will tend not to occur, and it is preferable for the size to be at least 1 nm because the crystal structure will be well defined and not amorphous, and there will be fewer changes such as gelling over time.

There are no particular restrictions on the shape of the nano-sized particles having a refractive index greater than that of the conductive matrix, which can be suitably selected according to the intended use, but favorable examples include a shape like a grain of rice, spherical, cuboid, spindle shaped, and irregular. For the aforementioned titanium oxide microparticles, just one type may be used alone, or two or more types may be used together.

In order to raise the refractive index of the conductive layer, the nano-sized particles having a refractive index greater than that of the conductive matrix preferably have a refractive index of at least 2.0 and no more than 3.0, more preferably at least 2.2 and no more than 3.0, even more preferably at least 2.2 and no more than 2.8, and particularly preferably at least 2.2 and no more than 2.6. It is preferable for the aforementioned refractive index to be at least 2.0 because the refractive index of the conductive layer can be effectively raised, and it is preferable for the aforementioned refractive index to be no more than 3.0 because there will be no discoloration of the particles or other such problems.

The refractive index of the nano-sized particles having a refractive index greater than that of the conductive matrix can be measured as follows: A resin material having a known refractive index is doped with particles having a refractive index greater than that of the conductive matrix, and the resin material in which these particles have been dispersed is formed as a coating film over a silicon substrate or a quartz substrate. The refractive index of this coating film is measured with an ellipsometer, and the refractive index of the aforementioned particles is found from the volume fraction of the aforementioned particles and the resin material constituting the aforementioned coating film.

Because of the need to raise the refractive index of the aforementioned conductive layer above the refractive index of the organic layer (and particularly the light-emitting layer), it is preferable for the nano-sized particles having a refractive index greater than that of the conductive matrix to be contained in the conductive layer in an amount of at least 10 vol % and no more than 50 vol %, more preferably at least 15 vol % and no more than 50 vol %, and even more preferably at least 20 vol % and no more than 50 vol %, with respect to the entire volume of the conductive layer. It is preferable for this content to be at least 10 vol % because the refractive index of the conductive layer can be effectively raised, and the light extraction effect can be improved, and it is preferable for the aforementioned content to be no more than 50 vol % because Rayleigh scattering will not be strong, and the light extraction effect can be improved.

In the present invention, from the standpoint of increasing light extraction efficiency, the refractive index of the component having a refractive index equal to or higher than the refractive index of the organic light-emitting layer (the refractive index of the conductive layer) is equal to or higher than the refractive index of the organic light-emitting layer of the organic electroluminescent element, and in concrete terms, it is preferably at least 1.7 and no more than 2.2, more preferably at least 1.7 and no more than 2.1, and even more preferably at least 1.7 and no more than 2.0.

The resistance of the conductive layer is preferably at least $1\Omega/\square$ ($\Omega$/sq.) and no more than $1000\Omega/\square$, more preferably at least $1\Omega/\square$ and no more than $500\Omega/\square$, and even more preferably at least $1\Omega/\square$ and no more than $300\Omega/\square$.

The absorbency of the conductive layer, which is expressed by $A(\lambda)$ above, is preferably at least 0.001 and no more than 1, more preferably at least 0.001 and no more than 0.5, and even more preferably at least 0.001 and no more than 0.1.

(Conductive Matrix)

The component having a refractive index equal to or higher than that of the organic light-emitting layer of the present invention preferably contains a conductive matrix. The conductive matrix is preferably a conductive polymer.

The conductive polymer is preferably a π-conjugated conductive polymer or a σ-conjugated conductive polymer and more preferably a π-conjugated conductive polymer.

Examples of σ-conjugated conductive polymers include poly(methylphenylsilane), poly(methylpropylsilane), poly(phenyl-p-biphenylsilane), and poly(dihexylsilane).

—π-Conjugated Conductive Polymer—

There are no particular restrictions on the π-conjugated conductive polymer as long as it is an organic polymer whose main chain is constituted by a π-conjugated system. The π-conjugated conductive polymer is preferably a π-conjugated heterocyclic compound or a derivative of a π-conjugated heterocyclic compound because of the stability of the compounds and high conductivity.

Examples of π-conjugated conductive polymers include at least one type selected from the group composed of aliphatic conjugated polyacetylene, polyacene, and polyazulene, aromatic conjugated polyphenylene, heterocyclic conjugated polypyrrole, polythiophene, and polyisothianaphthene, heteroatom-containing conjugated polyaniline and polythienylenevinylene, mixed-type conjugated poly(phenylenevinylene), a double chain conjugated system which is a conjugated system having a plurality of conjugate chains in a molecule, derivatives of these conductive polymers, and conductive complexes which are polymers obtained by grafting or block-copolymerization of these conjugate polymer chains to a saturated polymer From the standpoint of stability in air, polypyrrole, polythiophene, polyaniline, and derivatives of these are preferable, and polythiophene, polyaniline, and derivatives of these (specifically, polythiophene, polyaniline, polythiophene derivatives, and polyaniline derivatives) are more preferable.

Even an unsubstituted π-conjugated conductive polymer can have sufficient conductivity and miscibility in the binder resin, but in order to enhance conductivity and miscibility, a functional group such as an alkyl group, a carboxy group, a sulfo group, an alkoxy group, or a hydroxy group is preferably introduced into the π-conjugated conductive polymer.

Concrete examples of π-conjugated conductive polymers include:

polypyrroles: polypyrrole, poly(N-methylpyrrole), poly(3-methylpyrrole), poly(3-ethylpyrrole), poly(3-n-propylpyrrole), poly(3-butylpyrrole), poly(3-octylpyrrole), poly(3-decylpyrrole), poly(3-dodecylpyrrole), poly(3,4-dimethylpyrrole), poly(3,4-dibutylpyrrole), poly(3-carboxypyrrole), poly(3-methyl-4-carboxypyrrole), poly(3-methyl-4-carboxyethylpyrrole), poly(3-methyl-4-carboxybutylpyrrole), poly(3-hydroxypyrrole), poly(3-methoxypyrrole), poly(3-ethoxypyrrole), poly(3-butoxypyrrole), and poly(3-methyl-4-hexyloxypyrrole);

polythiophenes: poly(thiophene), poly(3-methylthiophene), poly(3-ethylthiophene), poly(3-propylthiophene), poly(3-butylthiophene), poly(3-hexylthiophene), poly(3-heptylthiophene), poly(3-octylthiophene), poly(3-decylthiophene), poly(3-dodecylthiophene), poly(3-octadecylthiophene), poly(3-bromothiophene), poly(3- chlorothiophene), poly(3-iodothiophene), poly(3-cyanothiophene), poly(3-phenylthiophene), poly(3,4-dimethylthiophene), poly(3,4-dibutylthiophene), poly(3-hydroxythiophene), poly(3-methoxythiophene), poly(3-ethoxythiophene), poly(3-butoxythiophene), poly(3-hexyloxythiophene), poly(3-heptyloxythiophene), poly(3-octyloxythiophene), poly(3-decyloxythiophene), poly(3-dodecyloxythiophene), poly(3-octadecyloxythiophene), poly(3-methyl-4-methoxythiophene), poly(3,4-ethylenedioxythiophene), poly(3-methyl-4-ethoxythiophene), poly (3-carboxythiophene), poly(3-methyl-4-carboxythiophene), poly(3-methyl-4-carboxyethylthiophene), and poly(3-methyl-4-carboxybutylthiophene); and polyanilines: polyaniline, poly(2-methylaniline), poly(3-isobutylaniline), poly(2-anilinesulfonic acid), and poly(3-anilinesulfonic acid).

—Polymer Dopant Having an Anionic Group—

It is preferable for the π-conjugated conductive polymer to be used along with a polymer dopant having an anionic group (also called a "polyanion dopant"). Specifically, in this case, the result is an organic conductive polymer composition that includes an organic conductive polymer compound (a π-conjugated conductive polymer) and a polymer dopant having an anionic group. The use of a π-conjugated conductive polymer in combination with a polymer dopant having an anionic group increases the conductivity, improves the stability of this conductivity over time, and improves water resistance in a laminate state.

Examples of polyanion dopants include polymers which have the structure of at least one of a substituted or unsubstituted polyalkylene, a substituted or unsubstituted polyalkenylene, a substituted or unsubstituted polyimide, a substituted or unsubstituted polyamide, and a substituted or unsubstituted polyester, and which include structural units having an anionic group.

Examples of the anionic group of the polyanion dopant include $-O-SO_3^-X^+$, $-SO_3^-X^+$, and $-COO^-X^+$ (in each formula, $X^+$ represents a hydrogen ion or an alkali metal ion).

Of these, $-SO_3^-X^+$ and $-COO^-X^+$ are preferable from the standpoint of doping performance in an organic conductive polymer compound.

Of the aforementioned polyanion dopants, from the standpoint of solvent solubility and conductivity, preferable examples include polyisoprenesulfonic acid, a copolymer including polyisoprenesulfonic acid, polysulfoethyl methacrylate, a copolymer including polysulfoethyl methacrylate, poly(4-sulfobutyl methacrylate), a copolymer including poly(4-sulfobutyl methacrylate), polymethallyloxybenzenesulfonic acid, a copolymer including polymethallyloxybenzenesulfonic acid, polystyrenesulfonic acid, and a copolymer including polystyrenesulfonic acid.

A range of monomer units of 10 to 100,000 is preferable for the degree of polymerization of the polyanion dopant, and a range of 50 to 10,000 is more preferable from the standpoint of solvent solubility and conductivity.

The amount in which the polyanion dopant is contained is preferably in the range of 0.1 to 10 mol per mole of the organic conductive polymer compound, and more preferably in the range of 1 to 7 mol. The molar number here is defined by the number of structural units deriving from the monomer including an anionic group that forms the polyanion dopant and the number of structural units deriving from the monomer such as pyrrole, thiophene, or aniline that forms the organic conductive polymer compound. If the polyanion dopant content is at least 0.1 mol per mole of the organic conductive polymer compound, the doping effect to the organic conductive polymer compound will be higher, and sufficient conductivity will be exhibited. In addition, dispersibility and solubility in a solvent are better, and a uniform dispersion can easily be obtained. Furthermore, if the polyanion dopant content is 10 mol or less per mole of the organic conductive polymer compound, a large amount of the organic conductive polymer compound can be contained, and sufficient conductivity can easily be obtained.

—Solubility in Organic Solvent or Water—

From the standpoint of coatability, the conductive polymer is preferably soluble in an organic solvent or water. In more concrete terms, the conductive polymer is preferably soluble in an amount of at least 1.0 wt % in water or an organic solvent having a water content of 5 wt % or less and a dielectric constant of 2 to 30. [The term] "soluble" here means that [the polymer] will dissolve in the solvent in a single molecular state or in a state in which a plurality of single molecules are associated, or [the polymer] will disperse in a particulate state at a particle size of 300 nm or less.

In general, organic conductive polymers have high hydrophilicity and dissolve in water or solvents containing water as their main component. Examples of methods for making such an organic conductive polymer soluble in an organic solvent include adding a compound that raises affinity with organic solvents to a composition containing the organic conductive polymer, or adding a dispersant in an organic solvent. Moreover, when an organic conductive polymer and a polyanion dopant are used, it is preferable for the polyanion dopant to undergo a hydrophobization treatment.

Favorable organic solvents include, for example, alcohols, aromatic hydrocarbons, ethers, ketones, and esters.

The conductive layer can be produced by coating a transparent substrate with the various types of material discussed above by a publicly known thin film formation method such as dip coating, air knife coating, curtain coating, roller coating, wire bar coating, gravure coating, micro gravure coating, or extrusion coating, and then drying and irradiating [the film] with light and/or heat. Preferably, curing by irradiation with light is advantageous in terms of quick curing. Furthermore, after the photosetting treatment, it is also preferable to perform a heat treatment after stopping the curing of the diffused layer (polymerization reaction) brought about by a photopolymerization initiator. In this case, the heating temperature is preferably 60 to 105° C., more preferably 70 to 100° C., and even more preferably 70 to 90° C.

Any light source may be used for the optical irradiation as long as it is near the wavelength (absorption wavelength) at which the photopolymerization initiator reacts. When the absorption wavelength is in the ultraviolet band, examples of light sources include various mercury vapor lamps of low, medium, high, or ultra-high pressure, chemical lamps, carbon arc lamps, metal halide lamps, xenon lamps, and sunlight. Various kinds of laser light source that can provide wavelengths from 350 to 420 nm may also be converted for multibeam irradiation. In addition, when the absorption wavelength is in the infrared band, examples of light sources include halogen lamps, xenon lamps, and high-pressure sodium lamps, and various kinds of laser light source that can provide wavelengths from 750 to 1400 nm may also be converted for multibeam irradiation.

In the case of radical photopolymerization by optical irradiation, it can be performed in air or an inert gas, but using an atmosphere containing as little oxygen as possible is preferable in order to shorten the induction period of polymerization of a radical polymerizable monomer, to sufficiently raise the polymerization rate, and the like. The aforementioned oxygen concentration range is preferably 0 to 1000 ppm, more preferably 0 to 800 ppm, and even more preferably 0 to 600 ppm. The intensity of the irradiating UV rays is preferably 0.1 to 100 mW/cm$^2$, and the amount of optical irradiation on the coating film surface is preferably 100 to 10,000 mJ/cm$^2$, more preferably 100 to 5000 mJ/cm$^2$, and particularly preferably 100 to 1000 mJ/cm$^2$. If the aforementioned amount of optical irradiation is less than 100 mJ/cm$^2$, the conductive layer will not cure adequately and may crumble during washing of the substrate or dissolve during application of other coating layers over the conductive layer. On the other hand, if the aforementioned amount of optical irradiation exceeds 10,000 mJ/cm$^2$, polymerization of the conductive layer may proceed too far, causing the surface to yellow, the transmissivity to decrease, and the light extraction efficiency to decrease in some cases. Furthermore, the temperature in the optical irradiation step is preferably 15 to 70° C., more preferably 20 to 60° C., and particularly preferably 25 to 50° C. If this temperature is lower than 15° C., curing of the conductive layer by photopolymerization may take a long time, but if 70° C. is exceeded, this may affect the photopolymerization initiator itself, making photopolymerization (curing) impossible in some cases.

(Substrate)

The substrate in the organic electroluminescent element of the present invention is preferably a transparent substrate.

There are no particular restrictions on the shape, structure, size, material, and so forth of the aforementioned transparent substrate, which can be suitably selected according to the intended use, but an example of the aforementioned shape is a flat shape, the aforementioned structure may be a single-layer structure or a laminated structure, and the aforementioned size can be selected as appropriate.

There are no particular restrictions on the material of the aforementioned substrate, which can be suitably selected according to the intended use; examples include yttria-stabilized zirconia (YSZ), glass (such as alkali-free glass and soda-lime glass), and other such inorganic materials; polyethylene terephthalate (PET), polyethylene naphthalate (PEN), and other such polyester resins; polycarbonate, polyimide resins (PI), polyethylene, polyvinyl chloride, polyvinylidene chloride, polystyrene, and styrene-acrylonitrile copolymers. These may be used singly, or two or more types may be used together. Of these, a polyester resin is preferable, and from the standpoint of suitability to roll coating, polyethylene terephthalate (PET) and polyethylene naphthalate (PEN) are particularly preferable.

The surface of the aforementioned substrate is preferably subjected to a surface activation treatment to improve adhesion with the conductive layer provided over this surface. Examples of this surface activation treatment include glow discharge treatment, corona discharge treatment, silane coupling treatment of the glass substrate, and so forth.

The aforementioned substrate may be produced as needed, or a commercially available product may be used.

There are no particular restrictions on the thickness of the aforementioned substrate, which can be suitably selected according to the intended use, [but] it is preferably at least 10 μm and more preferably at least 50 μm.

The refractive index of the aforementioned substrate is preferably at least 1.3 and no more than 1.8, more preferably at least 1.4 and no more than 1.7, and even more preferably at least 1.4 and no more than 1.6. If the refractive index of the aforementioned substrate is at least 1.3, the difference in the refractive index will not be too large between the substrate and the conductive layer, and when light from the conductive layer is incident [on the substrate], Fresnel reflection will not be too strong, making it easier to increase light extraction efficiency. If the refractive index of the aforementioned substrate is no more than 1.8, the difference in the refractive index will not be too large between the substrate and the air (the light emission side), and Fresnel reflection will not be too strong, making it easier to increase light extraction efficiency.

(Configuration of Conductive Layer)

The conductive layer in the present invention may be configured of a single layer or a plurality of layers. If the conductive layer is configured of a plurality of layers, from the standpoints of ensuring flatness and also adjusting the diffusion effect, the conductive layer is preferably configured from two layers.

In cases where the conductive layer is configured from two layers, it is preferable for the two layers to be composed of a layer that contains light scattering particles and a layer that does not contain light scattering particles and for the layer that does not contain light scattering particles to be on the organic layer side. Putting the layer that does not contain light scattering particles on the organic layer side is preferable in terms of ensuring flatness of the surface of the conductive layer on the side that is in contact with the organic layer and eliminating the risk of electrical leakage within the organic layer caused by unevenness of the conductive layer, as well as the decrease in light extraction efficiency that would be attendant on this leakage. The electrical leakage referred to in this Specification indicates the leakage of current, for example.

Moreover, from the standpoints of adhesion between the two layers constituting the conductive layer and reducing reflection caused by a difference in refractive index, the layer that contains light scattering particles is preferably such that the components other than light scattering particles are the same as those in the layer that does not contain light scattering particles.

In addition, the organic electroluminescent element in the present invention is an organic electroluminescent element in which a substrate, a first electrode adjacent to this substrate, an organic layer including at least one organic light-emitting layer, and a second electrode adjacent to this organic layer are formed in this order, with this organic electroluminescent element being preferably such that at least one of the aforementioned electrodes is a transparent electrode configured from two layers, these two layers both contain a conductive matrix, one of the aforementioned two layers contains at least one type of light scattering particles that are transparent and that have a primary particle size of at least 0.5 μm and is composed of the aforementioned light scattering particles and a component having a refractive index equal to or higher than the refractive index of the aforementioned organic light-emitting layer, and the other layer does not contain light scattering particles and has a refractive index that is equal to or higher than the refractive index of the organic light-emitting layer.

Furthermore, the organic electroluminescent element in the present invention is preferably such that of the two layers, the layer that does not contain light scattering particles is adjacent to the organic layer from the aforementioned standpoint of ensuring flatness of the surface of the conductive layer on the side that is in contact with the organic layer.

(Metal Electrode)

It is preferable with the organic electroluminescent element of the present invention for either the first electrode or the second electrode to be a conductive layer and for the remaining other electrode, which is not a conductive layer, to be a metal electrode. Moreover, of the aforementioned first electrode and second electrode, the first electrode is preferably the conductive layer, and the aforementioned metal electrode is preferably used in the second electrode as a reflecting electrode.

Examples of the material that configures the aforementioned metal electrode include alkali metals (such as lithium, sodium, potassium, and cesium), alkaline earth metals (such as magnesium and calcium), gold, silver, lead, aluminum, sodium-potassium alloys, lithium-aluminum alloys, magnesium-silver alloys, indium, ytterbium, and other such rare earth metals. These may be used singly, but from the standpoint of achieving both stability and electron injection properties, two or more types can be favorably used together. Of these, an alkali metal or alkaline earth metal is preferable in terms of electron injection properties, while a material whose main component is aluminum is preferable in terms of excellent storage stability. In addition, from the standpoint of luminous efficiency, a material whose main component is silver, which has high reflectivity, is preferable. The "material whose main component is aluminum" refers to aluminum alone, an alloy of aluminum and 0.01 to 10 wt % alkali metal or alkaline earth metal, or a mixture of these (such as a lithium-aluminum alloy or a magnesium-aluminum alloy). The "material whose main component is silver" refers to silver alone, or a mixture of silver and 0.01 to 10 wt % alkaline earth metal or other metal (such as alloys of silver with magnesium, calcium, etc.).

(Wiring with Lower Resistance than First Electrode)

It is preferable if the organic electroluminescent element of the present invention has wiring whose resistance is lower than that of the aforementioned first electrode (also called "auxiliary wiring") between the first electrode and the substrate. Having wiring whose resistance is lower than that of the first electrode makes it possible to lower the overall resistance of the transparent electrode combining the first electrode and the wiring, to suppress a drop in voltage even when the emission face of the organic electroluminescent element has a large surface area, and to prevent uneven light emission. When the light extraction involves diffusion, the light confined in the interior of the substrate or the organic layer can be taken off efficiently by emitting the light uniformly such that the emission face is large and there is no uneven emission. The organic electroluminescent element of the present invention more preferably has a configuration in which there is auxiliary wiring between the first electrode and the substrate, and the first electrode covers the auxiliary wiring. The first electrode can be provided so as to cover the wiring particularly by forming the first electrode by a coating method, so the organic electroluminescent element can have a configuration in which the wiring does not come into contact with the organic layer, and light emission is possible over the entire surface of the light-emitting layer.

The auxiliary wiring preferably contains a metal, more preferably contains silver, aluminum, gold, or copper, and even more preferably contains silver or aluminum.

The auxiliary wiring can be formed by vacuum vapor deposition of the aforementioned metal and etching with a mask or using photolithography. It can also be formed by printing, coating or the like with a conductive ink that contains the aforementioned metal.

From the standpoints of lowering the resistance of the first electrode and suppressing the formation of bumps on the surface by the auxiliary wiring, the thickness of the auxiliary wiring is preferably at least 10 nm and no more than 3 μm, more preferably at least 30 nm and no more than 1 μm, and even more preferably at least 50 nm and no more than 500 nm.

From the standpoints of blocking light and lowering the resistance of the first electrode, the width of the auxiliary wiring is preferably at least 1 μm and no more than 1 mm, more preferably at least 5 μm and no more than 500 μm, and even more preferably at least 10 μm and no more than 200 μm.

The shape of the auxiliary wiring can be broadly classified by the shape of a cross section perpendicular to the layer on which the auxiliary wiring is formed.

When auxiliary wiring in which there are angles in the shape of the aforementioned cross section (hereinafter also referred to as a "squared cross section") is used, the ITO layer, organic layer, etc., laminated over the auxiliary wiring forms a layer conforming to the shape of these angles, and there is the possibility that electrical leakage will occur as a result of the angular shape (steps).

On the other hand, when auxiliary wiring in which the shape of the aforementioned cross section is rounded ((hereinafter also referred to as a "not squared cross section") is used, the aforementioned angular shape will not be produced, so electrical leakage will tend not to occur.

(Other Layers)

With the organic electroluminescent element of the present invention, preferably at least the aforementioned second electrode and the aforementioned organic layer are sealed within a sealing can, and more preferably the aforementioned first electrode, the aforementioned second electrode, and the aforementioned organic layer are sealed within a sealing can.

(Organic Layer)

The aforementioned organic layer has at least an organic light-emitting layer. Examples of functional layers other than the aforementioned organic light-emitting layer include a hole transport layer, an electron transport layer, a hole blocking layer, an electron blocking layer, a hole injection layer, and an electron injection layer.

The aforementioned organic layer preferably has a hole transport layer between the anode and the organic light-emitting layer, and preferably has an electron transport layer between the cathode and the light-emitting layer. Furthermore, a hole injection layer may also be provided between the hole transport layer and the anode, and an electron injection layer may also be provided between the electron transport layer and the cathode.

Moreover, a hole transporting intermediate layer (electron blocking layer) may also be provided between the aforementioned organic light-emitting layer and the hole transport layer, and an electron transporting intermediate layer (hole blocking layer) may also be provided between the light-emitting layer and the electron transport layer. The various functional layers may be divided into a plurality of secondary layers.

These functional layers including the aforementioned organic light-emitting layer can be favorably formed by a dry film formation processes such as vapor deposition or sputtering, or by wet coating, transfer, printing, inkjetting, or the like.

—Organic Light-emitting Layer—

When an electric field is applied, the aforementioned organic light-emitting layer accepts holes from the anode, the hole injection layer, or the hole transport layer, accepts electrons from the cathode, the electron injection layer, or the electron transport layer, and has the function of emitting light by providing a site for the rebinding of holes and electrons.

The aforementioned organic light-emitting layer includes a light-emitting material. The aforementioned organic light-emitting layer may be made up of just a light-emitting material, or it may be a mixed layer of a host material and a light-emitting material (in the latter case, the light-emitting material will sometimes be called a "light-emitting dopant" or a "dopant"). The aforementioned light-emitting material may be a fluorescent material or a phosphorescent material, or may be a mixture of two or more types. The host material is preferably a charge transport material. There may be just one kind of host material, or two or more kinds may be used. In addition, a material which does not have a charge transporting property and does not emit light may be included in the organic light-emitting layer.

There are no particular restrictions on the thickness of the aforementioned organic light-emitting layer, which can be suitably selected according to the intended use, but 2 to 500 nm is preferable, and from the standpoint of external quantum efficiency, 3 to 200 nm is more preferable, and 5 to 100 nm is even more preferable. Furthermore, the aforementioned organic light-emitting layer may be a single layer or two or more layers, and the various layers may emit light of different colors.

—Light-emitting Material—

For the aforementioned light-emitting material, a phosphorescent material, a fluorescent material, or the like can be used favorably.

From the standpoint of drive durability, the aforementioned light-emitting material is preferably a dopant such that the difference in ionization potential ($\Delta$Ip) and the difference in electron affinity ($\Delta$Ea) from those of the host compound satisfy the relations 1.2 eV>$\Delta$Ip>0.2 eV and/or 1.2 eV>$\Delta$Ea>0.2 eV.

The light-emitting material in the aforementioned light-emitting layer is generally contained in the aforementioned light-emitting layer in an amount of 0.1 to 50 wt % with respect to the total weight of the compound forming the light-emitting layer, but from the standpoints of durability and external quantum efficiency, it is preferable to be contained in an amount of 1 to 50 wt % and more preferably 2 to 50 wt %.

—Phosphorescent Material—

A typical example of the aforementioned phosphorescent material is complexes containing transition metal atoms or lanthanoid atoms.

There are no particular restrictions on the aforementioned transition metal atoms, which can be suitably selected according to the intended use, [but] examples include ruthenium, rhodium, palladium, tungsten, rhenium, osmium, iridium, gold, silver, copper, and platinum. [Of these,] rhenium, iridium, and platinum are more preferable, and iridium and platinum are even more preferable.

Examples of ligands of the aforementioned complex include those discussed in "Comprehensive Coordination Chemistry," by G. Wilkinson et al., Pergamon Press (1987), "Photochemistry and Photophysics of Coordination Compounds," by H. Yersin, Springer-Verlag (1987), and "Yuuki Kinzoku Kagaku—Kiso to Ouyou [Organometallic Chemistry—Fundamentals and Applications]," by A. Yamamoto, Shokabo (1982).

The aforementioned complex may have just one transition metal atom in the compound, or may be a so-called dinuclear complex having two or more transition metal atoms. Different kinds of metal atoms may also be contained at the same time.

Of these, examples of phosphorescent materials include the phosphorescent compounds or the like described in publications of U.S. Pat. Nos. 6,303,238 B1, 6,097,147, WO 00/57676, WO 00/70655, WO 01/08230, WO 01/39234 A2, WO 01/41512 A1, WO 02/02714 A2, WO 02/15645 A1, WO 02/44189 A1, WO 05/19373 A2, WO 2004/108857 A1, WO 2005/042444 A2, WO 2005/042550 A1, Japanese Laid-Open Patent Applications 2001-247859, 2002-302671, 2002-117978, 2003-133074, 2002-235076, 2003-123982, and 2002-170684, EP 1211257, and Japanese Laid-Open Patent Applications 2002-226495, 2002-234894, 2001-247859, 2001-298470, 2002-173674, 2002-203678, 2002-203679, 2004-357791, 2006-93542, 2006-261623, 2006-256999, 2007-19462, 2007-84635, and 2007-96259. Of these, iridium complexes, platinum complexes, copper complexes, rhenium complexes, tungsten complexes, rhodium complexes, ruthenium complexes, palladium complexes, osmium complexes, europium complexes, terbium complexes, gadolinium complexes, dysprosium complexes, and cerium complexes are preferred, with iridium complexes, platinum complexes, and rhenium complexes being more preferred. Iridium complexes, platinum complexes, and rhenium complexes including at least one coordination mode from among metal-carbon bonds, metal-nitrogen bonds, metal-oxygen bonds, and metal-sulfur bonds are even more preferred. From the standpoints of luminous efficiency, drive durability, chromaticity, and so forth, iridium complexes, platinum complexes, and rhenium complexes including tridentate or higher polydentate ligand are particularly preferred.

The following compounds can be listed as concrete examples of the aforementioned phosphorescent material, but [the phosphorescent material] is not limited to these:

[First Chemical Formula]

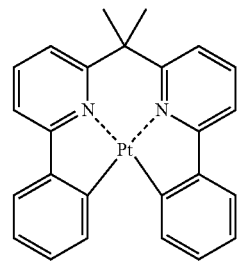

D-1

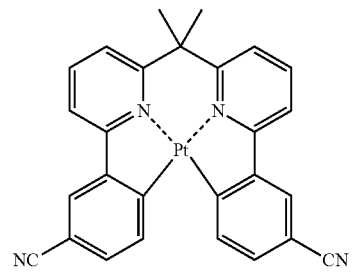

D-2

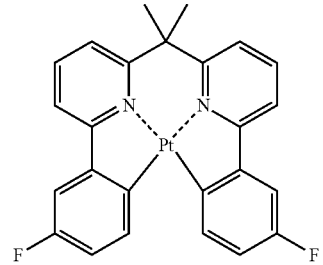

D-3

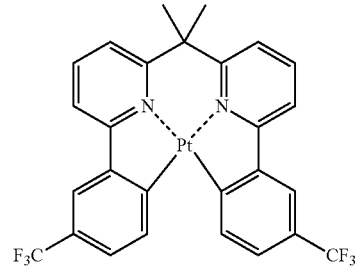

D-4

-continued
D-5
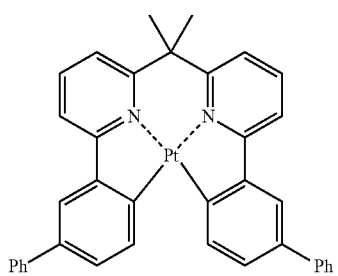
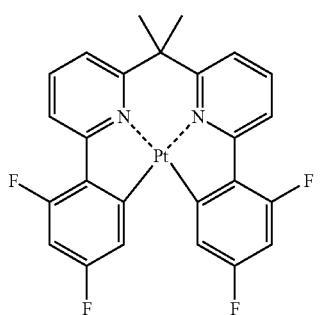
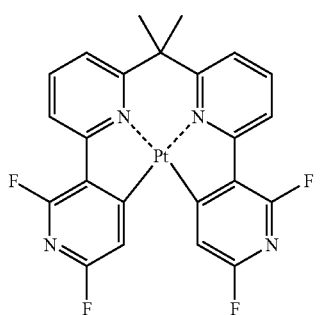
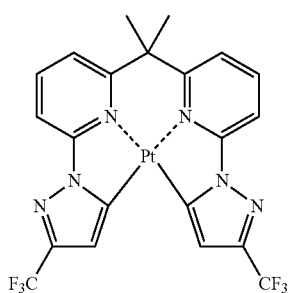
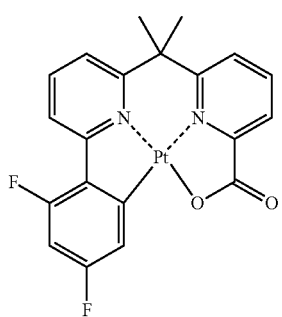
-continued
D-10
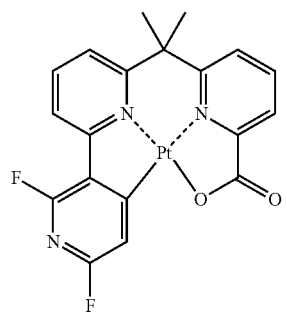
D-11
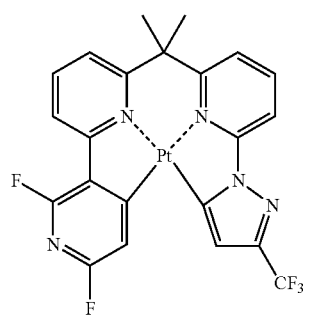
D-12
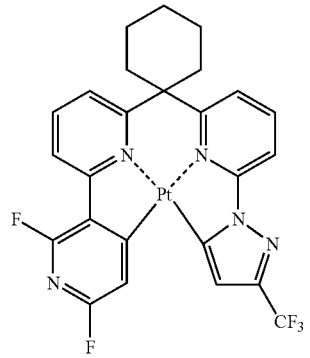
D-13
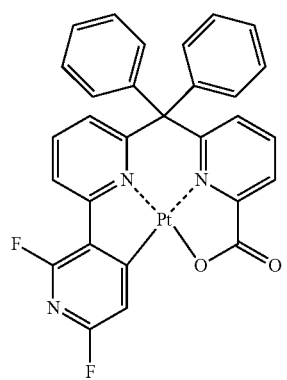

-continued
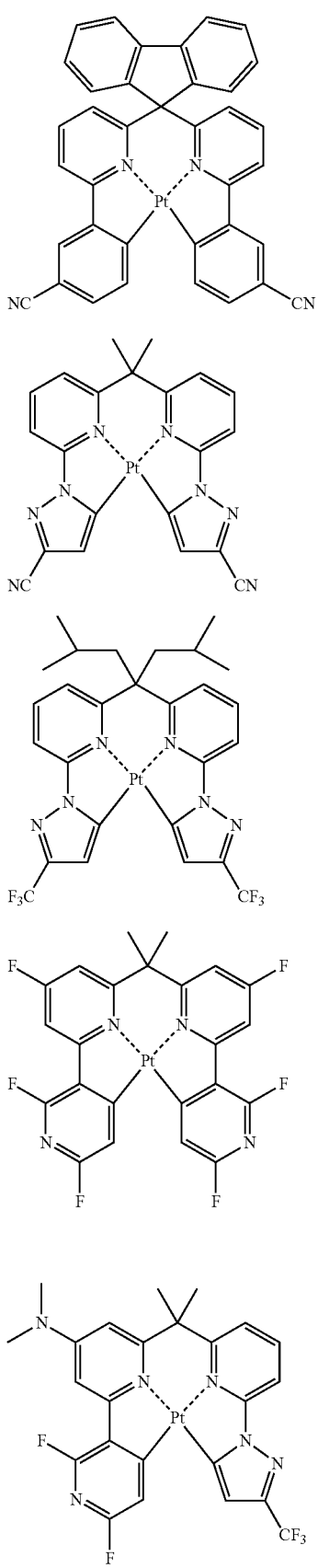
[Second Chemical Formula]
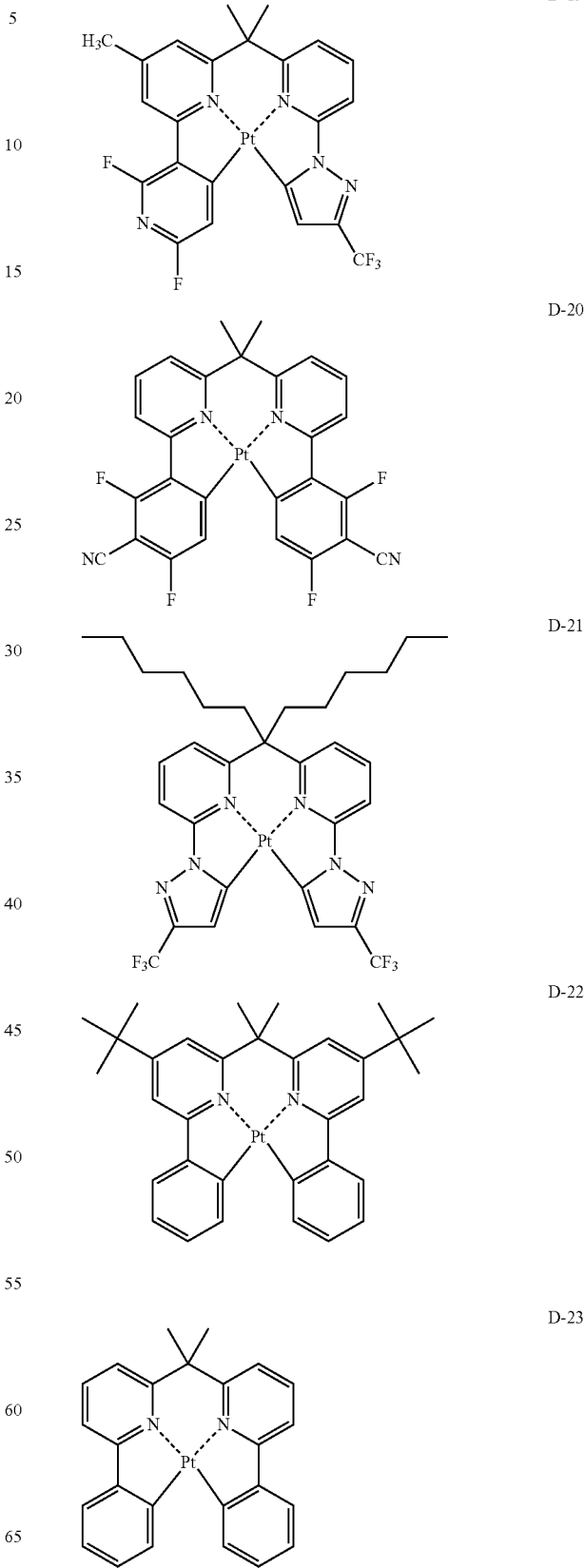

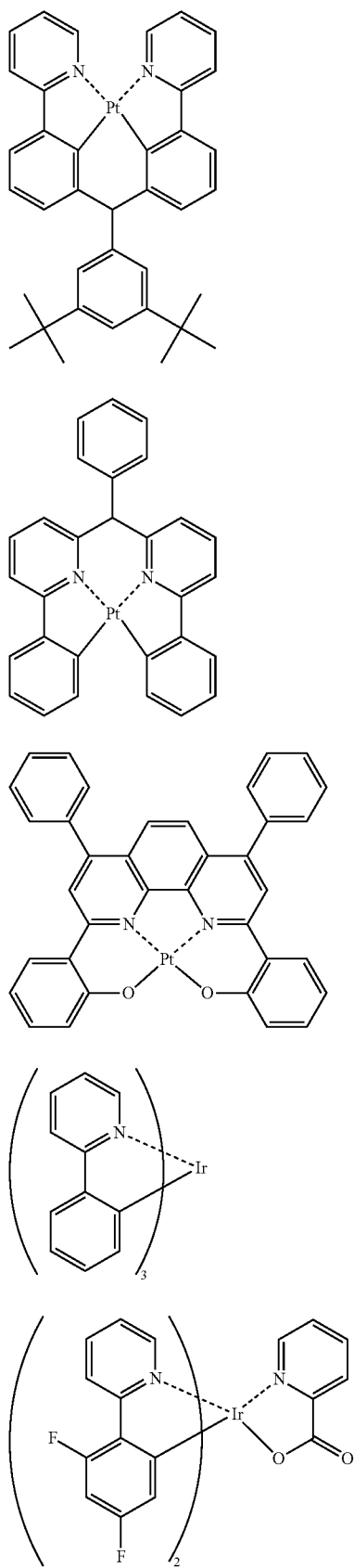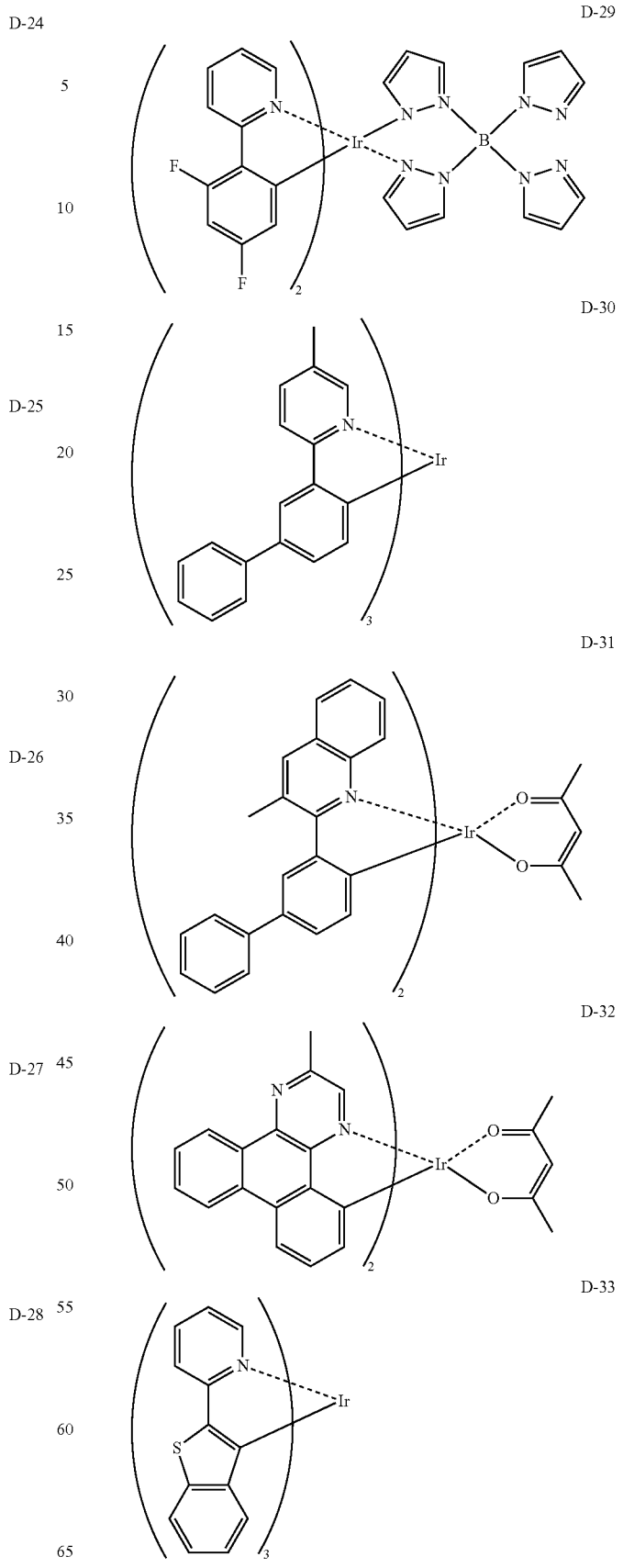

[Third Chemical Formula]

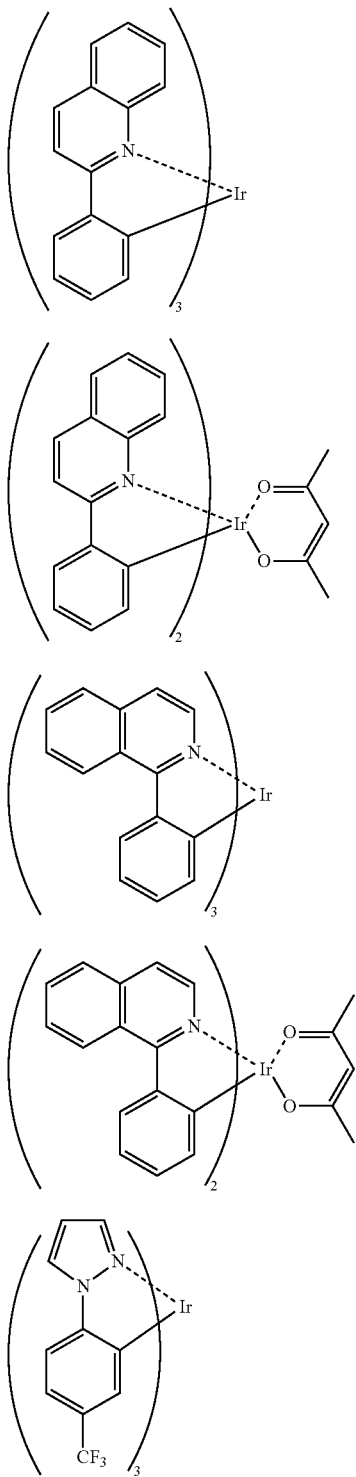

—Fluorescent Material—

There are no particular restrictions on the aforementioned fluorescent material, which can be suitably selected according to the intended use, [but] examples include benzoxazole, benzoimidazole, benzothiazole, styrylbenzene, polyphenyl, diphenylbutadiene, tetraphenylbutadiene, naphthalimide, coumarin, pyran, perinone, oxadiazole, aldazine, pyridine, cyclopentadiene, bis-styrylanthracene, quinacridone, pyrrolopyridine, thiadiazolopyridine, cyclopentadiene, styrylamine, aromatic dimethylidene compounds, condensed polyaromatic compounds (such as anthracene, phenanthroline, pyrene, perylene, rubrene, and pentacene), various types of metal complex (typified by metal complexes of 8-quinolynol, pyromethene complexes, and rare earth complexes), polymer compounds (such as polythiophene, polyphenylene, and polyphenylenevinylene), organosilanes, and derivatives of these.

—Host Material—

For the aforementioned host material, a hole transporting host material with excellent hole transporting properties (may also be referred to as a "hole transporting host") or an electron transporting host compound with excellent electron transporting properties (may also be referred to as an "electron transporting host") can be used.

—Hole Transporting Host Material—

The following materials can be listed as examples of the aforementioned hole transporting host material: namely, pyrrole, indole, carbazole, azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, conductive high-molecular-weight oligomers (such as thiophene oligomers and polythiophenes), organosilanes, carbon films, and derivatives of these.

Of these, indole derivatives, carbazole derivatives, aromatic tertiary amine compounds, thiophene derivatives, and compounds containing a carbazole group in the molecule are preferable, and compounds containing a t-butyl-substituted carbazole group are more preferable.

—Electron Transporting Host Material—

Examples of the electron transporting host material include pyridine, pyrimidine, triazine, imidazole, pyrazole, triazole, oxazole, oxadiazole, fluorenone, anthraquinonedimethane, anthrone, diphenylquinone, thiopyrane dioxide, carbodiimide, fluorenylidenemethane, distyrylpyradine, fluorine-substituted aromatic compounds, heterocyclic tetracarboxylic acid anhydrides (such as naphthalene [and] perylene), phthalocyanine, derivatives of these (which may form a condensed ring with another ring), and various metal complexes typified by a metal complex of an 8-quinolinol derivative, a metal phthalocyanine, and a metal complex containing benzoxazole or benzothiazole as a ligand. Of these, metal complex compounds are preferable from the standpoint of durability, and metal complexes having a ligand with at least one nitrogen atom, oxygen atom, or sulfur atom coordinated with the metal are more preferable. Examples of the aforementioned metal complex electron transporting host include the compounds described in publications of Japanese Laid-Open Patent Applications 2002-235076, 2004-214179, 2004-221062, 2004-221065, 2004-221068, and 2004-327313.

The following compounds can be listed as concrete examples of the aforementioned hole transporting host material and electron transporting host material, but [the compounds] are not limited to these:

[Fourth Chemical Formula]
H-1
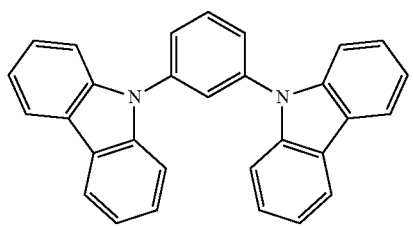
H-2
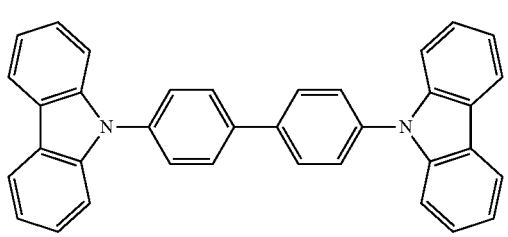
H-3
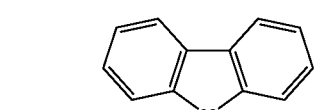
H-4
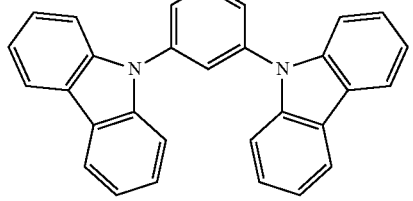
H-5
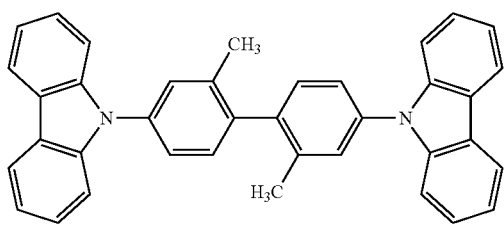
-continued
H-6
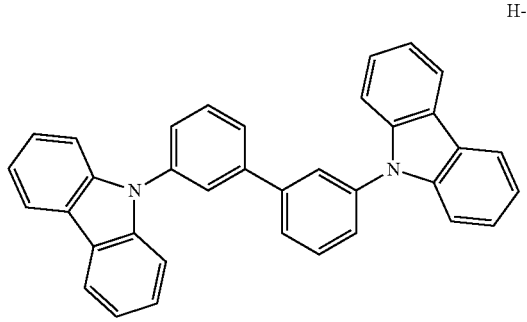
[Fifth Chemical Formula]
H-7
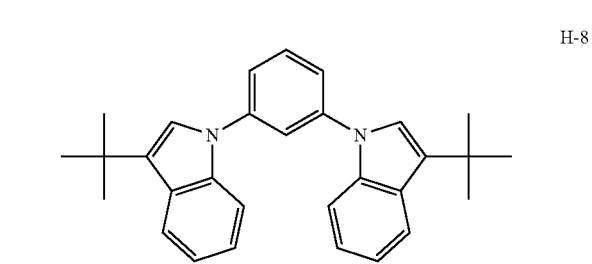
H-8
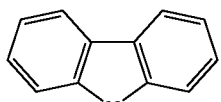

H-9
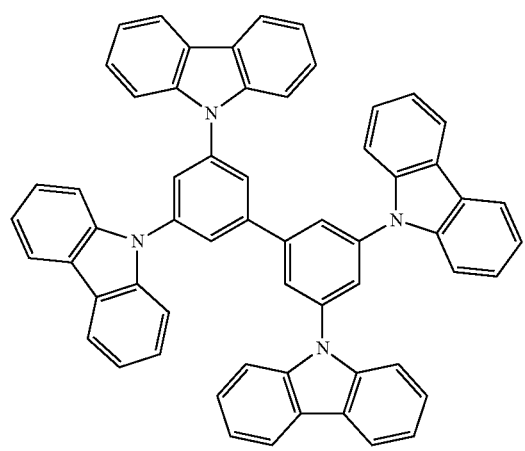
H-10
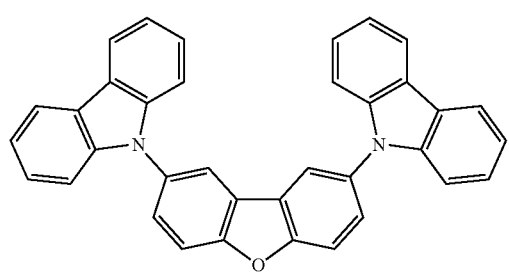
H-11
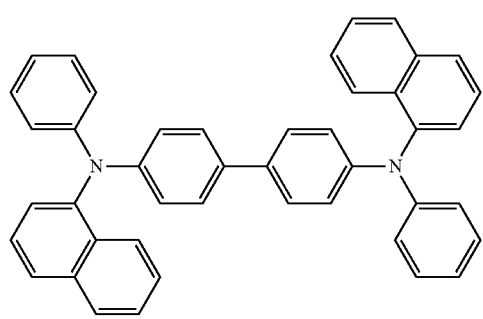
H-12
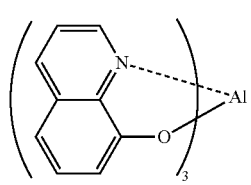
H-13
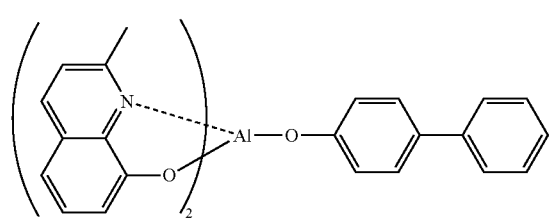
H-14
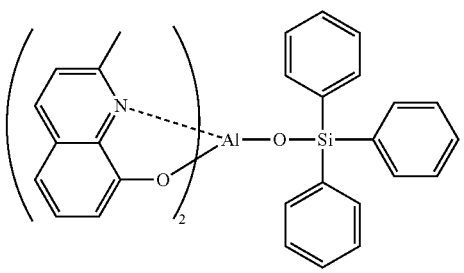
H-15
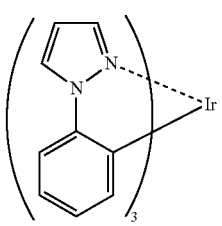
H-16
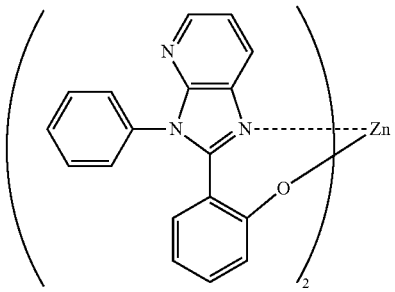
H-17
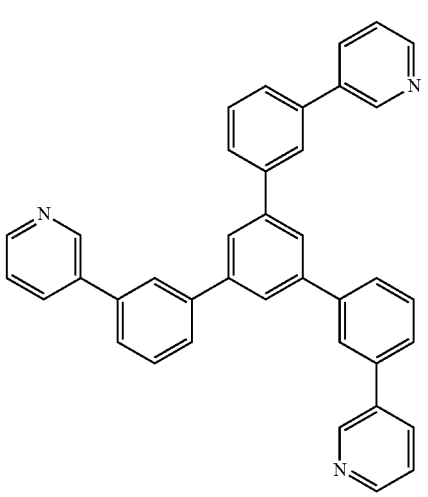

-continued

H-18

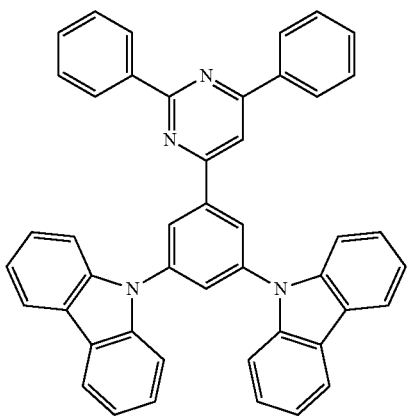

[Sixth Chemical Formula]

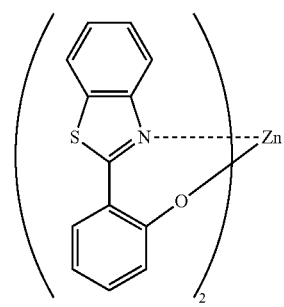

H-19

H-20

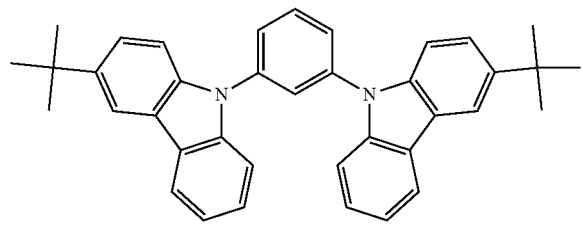

H-21

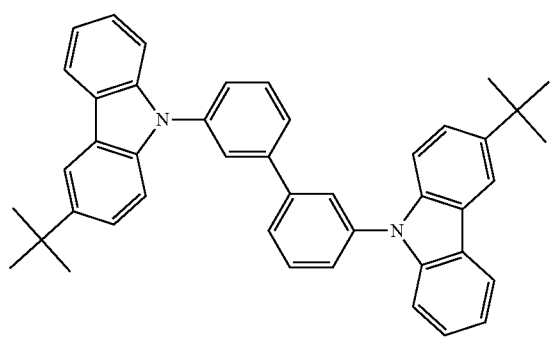

-continued

H-22

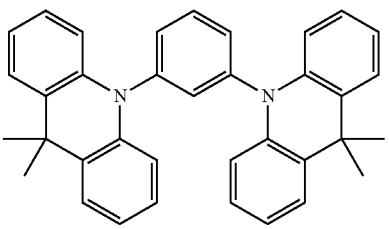

—Hole Injection Layer and Hole Transport Layer—

The aforementioned hole injection layer or the aforementioned hole transport layer is a layer having the function of accepting holes from the anode or from a layer on the anode side and transporting them to the cathode side. The hole injection material and hole transport material used in these layers may be a low-molecular-weight compound or a high-molecular-weight compound. In concrete terms, the layers preferably contain a pyrrole derivative, a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidine compound, a phthalocyanine compound, a porphyrin compound, a thiophene derivative, an organosilane derivative, carbon, or the like.

An electron accepting dopant can be contained in the aforementioned hole injection layer or the aforementioned hole transport layer. Either an inorganic compound or organic compound can be used as the electron accepting dopant introduced into the aforementioned hole injection layer or the hole transport layer as long as it has an electron accepting property and serves to oxidize an organic compound.

In concrete terms, examples of inorganic compounds include metal halides (such as ferric chloride, aluminum chloride, gallium chloride, indium chloride, and antimony pentachloride) and metal oxides (such as vanadium pentoxide and molybdenum trioxide). In the case of an organic compound, it is preferable to use a compound having as a substituent a nitro group, a halogen, a cyano group, a trifluoromethyl group, or the like, a quinone compounds, an acid anhydride compounds, fullerene, or the like.

These electron accepting dopants may be used singly, or two or more types may be used. The amount in which the electron accepting dopant is used will vary with the type of material, but it is preferably 0.01 to 50 wt %, more preferably 0.05 to 40 wt %, and particularly preferably 0.1 to 30 wt %, with respect to the hole transport layer material.

The aforementioned hole injection layer or hole transport layer may have a single-layer structure composed of one or more types of the aforementioned materials, or may have a multilayer structure composed of a plurality of layers of the same composition or different compositions.

—Electron Injection Layer and Electron Transport Layer—

The aforementioned electron injection layer or the aforementioned electron transport layer is a layer having the function of accepting electrons from the cathode or a layer on the cathode side and transporting them to the anode side. The electron injection material and electron transport material used in these layers may be a low-molecular-weight compound or a high-molecular-weight compound.

In concrete terms, it is preferable to use a layer containing a pyridine derivative, a quinoline derivative, a pyrimidine derivative, a pyrazine derivative, a phthalazine derivative, a phenanthoroline derivative, a triazine derivative, a triazole derivative, an oxazole derivative, an oxadiazole derivative, an imidazole derivative, a fluorenone derivative, an anthraquinodimethane derivative, an anthrone derivative, a diphenylquinone derivative, a thiopyrane dioxide derivative, a carbodiimide derivative, a fluorenylidenemethane derivative, a distyrylpyradine derivative, an aromatic tetracarboxylic acid anhydride such as perylene or naphthalene, a phthalocyanine derivative, various metal complexes typified by a metal complex of an 8-quinolinol derivative, a metal phthalocyanine, and a metal complex containing benzoxazole or benzothiazole as a ligand, an organosilane derivative typified by silole, or the like.

An electron donating dopant can be contained in the aforementioned electron injection layer or electron transport layer. The electron donating dopant introduced into the aforementioned electron injection layer or electron transport layer may be any material having an electron donating property and a property for reducing organic compounds, and alkali metals such as lithium, alkaline earth metals such as magnesium, transition metals including rare earth metals, reductive organic compounds, and the like are favorably used. Metals that can be used particularly favorably are those having a work function of 4.2 eV or less, concrete examples of which include lithium, sodium, potassium, beryllium, magnesium, calcium, strontium, barium, yttrium, cesium, lanthanum, samarium, gadolinium, and ytterbium. Furthermore, examples of reductive organic compounds include nitrogen-containing compounds, sulfur-containing compounds, and phosphorus-containing compounds.

These electron donating dopants may be used singly, or two or more types may be used. The amount in which the electron donating dopant is used will vary with the type of material, but it is preferably 0.1 to 99 wt %, more preferably 1.0 to 80 wt %, and particularly preferably 2.0 to 70 wt %, with respect to the electron transport layer material.

The aforementioned electron injection layer or the aforementioned electron transport layer may have a single-layer structure composed of one or more types of the aforementioned materials, or may have a multilayer structure composed of a plurality of layers of the same composition or different compositions.

—Hole Blocking Layer and Electron Blocking Layer—

The aforementioned hole blocking layer is a layer having the function of preventing the holes transported from the anode side to the organic light-emitting layer from escaping to the cathode side, and is usually provided as an organic compound layer that is adjacent to the light-emitting layer on the cathode side.

Meanwhile, the aforementioned electron blocking layer is a layer having the function of preventing the electrons transported from the cathode side to the organic light-emitting layer from escaping to the anode side, and is usually provided as an organic compound layer that is adjacent to the organic light-emitting layer on the anode side.

Examples of compounds that constitute the aforementioned hole blocking layer include BAlq and other such aluminum complexes, triazole derivatives, and phenanthroline derivatives such as BCP. Compounds given for the hole transport material above can be utilized as examples of compounds that constitute the electron blocking layer.

The thickness of the aforementioned hole blocking layer and electron blocking layer is preferably 1 to 500 nm, more preferably 5 to 200 nm, and even more preferably 10 to 100 nm. Moreover, the aforementioned hole blocking layer and electron blocking layer may have a single-layer structure composed of one or more types of the aforementioned materials, or may have a multilayer structure composed of a plurality of layers of the same composition or different compositions.

—Sealing Can—

There are no particular restrictions on the aforementioned sealing can so long as it has a size, shape, structure, and so forth that allow the sealing of an organic electroluminescent element including a first electrode, a second electrode, and an organic layer, and it can be suitably selected according to the intended use.

A moisture absorbent or an inert liquid may be sealed in the space between the aforementioned sealing can and the organic electroluminescent element including the first electrode, second electrode, and organic layer.

There are no particular restrictions on the aforementioned moisture absorbent, which can be suitably selected according to the intended use, [but] examples include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieves, zeolites, and magnesium oxide.

There are no particular restrictions on the aforementioned inert liquid, which can be suitably selected according to the intended use, [but] examples include paraffins, liquid paraffins, fluorine-based solvents such as perfluoroalkane, perfluoroamine, and perfluoroether, chlorine-based solvents, and silicone oils.

The aforementioned organic electroluminescent element can be configured as a device capable of display in full color.

Known methods for making the aforementioned organic electroluminescent element a full-color type include, for example, as discussed in Gekkan Disuprei [Monthly Display], September, 2000, pp. 33-37, a three-color light-emitting method in which a layer structure that emits light corresponding to each of the three primary colors (blue (B), green (G), and red (R)) is disposed on a substrate, a white method in which white light emitted from a layer structure for white light emission is passed through a color filter layer and separated into the three primary colors, and a color conversion method in which blue light emitted from a layer structure for blue light emission is passed through a fluorescent dye layer and converted into red (R) and green (G).

In this case, the laser power and thickness are preferably adjusted as appropriate for each blue (B), green (G), and red (R) pixel.

In addition, a plurality of layer structures of different emission colors obtained by the aforementioned methods may be used in combination to obtain a flat light source of the desired emission colors. For instance, [this can be] a white emission light source that combines blue and yellow light-emitting devices, a white emission light source that combines blue (B), green (G), and red (R) organic electroluminescent elements, or the like.

The aforementioned organic electroluminescent element can be used favorably in a variety of fields such as lighting devices, computers, onboard displays, outdoor displays, household devices, commercial devices, consumer devices, traffic displays, clock and watch displays, calendar displays, luminescent screens, and acoustic devices.

WORKING EXAMPLES

Working examples of the present invention will be described below, but the present invention is in no way limited to or by these working examples.

<Average Thickness of Conductive Layer, Diffused Layer, and Planarization Layer>

The average thickness of the conductive layer, the diffused layer, and the planarization layer can be found by cutting out part of each layer and measuring it with a scanning electron microscope (S-3400N, made by Hitachi High-Technologies Corporation).

<Measurement of Refractive Index>

The refractive index of the conductive layer was found by forming, on a silicon substrate or a quartz substrate, a film of a component having a refractive index equal to or higher than the refractive index of the aforementioned organic light-emitting layer in a thickness approximately corresponding to the wavelength of the light and measuring the refractive index of the film thus formed on the substrate with an ellipsometer.

The refractive index of the planarization layer and the refractive index of the conductive polymer of the conductive layer can be found in the same way.

<Production of Organic Electroluminescent Element>

—Production of Diffused Conductive Layer Coating Solution 1—

PEDOT-PSS (poly(3,4-ethylenedioxythiophene)-poly(styrenesulfonic acid)) was doped with a slurry in which titanium oxide ($TiO_2$) particles (with a primary particle size of 100 nm or less) were dispersed, and [this product] was thoroughly stirred with an omnimixer to obtain a conductive binder material. The refractive index of the aforementioned PEDOT-PSS was 1.50.

Note that the aforementioned titanium oxide particles used in the following working examples and comparative examples have all been given a surface treatment with aluminum oxide or the like for suppressing the photoactivity of the titanium oxide, and the refractive index thereof was 2.40.

The volumetric ratio of PEDOT-PSS and titanium oxide particles should be one at which the necessary refractive index will be obtained, and with pure titanium oxide, [the ratio] is about PEDOT-PSS:titanium oxide=7:3 to 6:4, but with a mixture or particles having a shell-core structure, the ratio should be adjusted as appropriate so as to obtain the necessary refractive index.

Transparent particles with a high refractive index (such as zirconium oxide particles or another such particulate transparent material) or particles in the form of a slurry or sol may be added instead of titanium oxide.

Next, light scattering particles having the desired size (such as "MX-150," made by Soken Chemical & Engineering, which is crosslinked acrylic particles with a primary particle size of 1.5 μm) were stirred with a stirrer while being used to dope the aforementioned conductive binder material. The light scattering particles were then thoroughly dispersed with an omnimixer, which gave a diffused conductive layer coating solution 1.

An inorganic material (such as zirconium oxide or titanium oxide) with a size of about 1 to 10 μm may be added instead of the crosslinked acrylic or other resin particles.

The refractive index of the conductive binder was 1.8 (PEDOT-PSS+titanium oxide slurry), and the refractive index of the light scattering particles was 1.49 (in the case of the crosslinked acrylic particles), so there was a sufficiently large difference in the refractive index, and diffusion that was adequate for light extraction was obtained even with a thin film.

The volumetric ratio of the light scattering particles and the conductive binder material was about 50:50 with conductive binder:light scattering particles MX-150, but when flatness is taken into account, [the ratio] may be lowered to about 70:30 to 80:20.

—Production of Diffused Conductive Layer Coating Solution 2—

Just as in the "production of diffused conductive layer coating solution 1" described above, a slurry in which titanium oxide particles were dispersed was used to dope PEDOT-PSS, and [this product] was thoroughly stirred with an omnimixer, which gave a diffused conductive layer coating solution 2.

The volumetric ratio of the PEDOT-PSS and the titanium oxide particles should be one at which the necessary refractive index will be obtained, and with titanium oxide, [the ratio] is about 7:3 to 6:4.

Transparent particles with a high refractive index (such as zirconium oxide particles or another such particulate transparent material) may be added instead of titanium oxide.

—Production of Coating Material for Planarization Layer (Comparative Example)—

A titanium oxide dispersion (a dispersion of nanoparticles of titanium oxide with a primary particle size of 15 nm; material name: titanium oxide-dispersed toluene, trade name: HTD-760T High Transparency Titanium Oxide Slurry), a resin material (material name: fluorene derivative, trade name: OGSOL EA-0200 (hereinafter also referred to as "binder")), and toluene were dissolved and stirred with a roller and stirrer, and then the nanoparticles were thoroughly dispersed in the binder by ultrasonic waves to obtain a coating material for the planarization layer.

—Production of Coating Material for Diffused Layer (Comparative Example)—

Light scattering particles (crosslinked acrylic particles with a primary particle size of 1.5 μm, material name: EX-150) and a toluene solvent were stirred with a stirrer while being used to dope the aforementioned coating material for the planarization layer.

The light scattering particles were then thoroughly dispersed in a base material by ultrasonic waves and further stirred well with a stirrer or the like to obtain a coating material for the diffused layer.

The refractive index of the base material (titanium oxide and binder dispersion) during curing was 1.8, and the refractive index of the light scattering particles was 1.49, so the difference in the refractive index was sufficiently large, and diffusion that was adequate for light extraction was obtained even with a thin film.

In addition, since toluene was used as the solvent, the resin particles need to have adequate solvent resistance, but here again, this combination of materials stands up well to solvents, and was extremely superior in regard to degradation of the dispersion (clumping, etc.) due to changes over time.

—Glass Substrate Surface Treatment—

The glass substrate was subjected to a silane coupling treatment to improve adhesion between the diffused layer and the glass. In cases where a diffused conductive layer coating solution is used, this treatment is unnecessary, and an ordinary glass substrate treatment (washing) that is performed prior to the formation of a film of an organic layer or ITO may be carried out.

—Film Formation of Photolithographic Auxiliary Wiring—

After the film formation of the diffused layer or planarization layer, a 100-nm film of silver was formed as auxiliary wiring by vacuum vapor deposition, and this was put into the auxiliary wiring shape by photolithography.

—Film Formation of Mask Auxiliary Wiring—

After the film formation of the diffused layer or planarization layer, a 100-nm film of silver was formed with a metal mask as auxiliary wiring by vacuum vapor deposition. The resulting shape by a metal mask became more rounded than the wiring shape obtained by etching.

—Film Formation of Diffused Conductive Layer 1—

The aforementioned diffused conductive layer coating solution 1 was used to coat the aforementioned substrate with an edge coater. After this coating, [the film] was dried and cured in a 120° C. environment, which gave a diffused conductive layer (first electrode).

—Film Formation of Diffused Conductive Layer 2—

Depending on the degree of unevenness on the surface of the diffused conductive layer 1, a diffused conductive layer coating solution 2 may be applied over the diffused conductive layer 1.

This can be used not only to ensure flatness, but also to adjust the diffusion effect. The refractive index of the two layers may also be varied.

—Production of Planarization Layer and Diffused Layer (Comparative Example)—

A polymerization initiator was added to the completed coating material of the planarization layer and the coating material of the diffused layer.

A glass substrate that had been washed and given a surface treatment was coated with the coating material of the diffused layer using a wire bar, after which [the coating] was cured for 10 minutes under UV irradiation (365 nm), which gave a diffused layer (5 μm).

The diffused layer was coated with the coating material of the planarization layer using a wire bar, and [the coating] was cured under UV irradiation, which gave a laminated diffused layer and planarization layer.

—Film Formation of ITO (First Electrode) (Comparative Example)—

ITO was formed in [a thickness of] 100 nm using a sputtering device over the planarization (diffused) layer formed on the substrate.

—Production of Organic Electroluminescent Light-emitting Layer (Organic EL Layer)—

A vacuum vapor deposition apparatus was used to deposit HAT-CN (10 nm), 2-TNATA (4,4',4"-tris(N,N-(2-naphthyl)-phenylamino)triphenylamine: 99.9 vol %), and F4-TCNQ (0.2 vol %) (co-deposited at 160 nm) on the first electrode on the substrate produced by the aforementioned method, thus forming a hole injection layer.

NPD (bis[N-(1-naphthyl)-N-phenyl]benzidine) (10 nm), mCP (1,3-bis(carbazol-9-yl)benzene: 60 vol %), and a light-emitting material A (40 vol %) (co-deposited at 30 nm) were deposited over this to form an organic light-emitting layer.

Furthermore, BAlq (bis-(2-methyl-8-quinolinolato)-4-(phenyl-phenolate)-aluminum(III)) was laminated [over this] (40 nm) to form an electron transport layer, which gave an organic layer.

Note that the organic light-emitting layer in the organic layer thus obtained had a refractive index of 1.70.

[Seventh Chemical Formula]

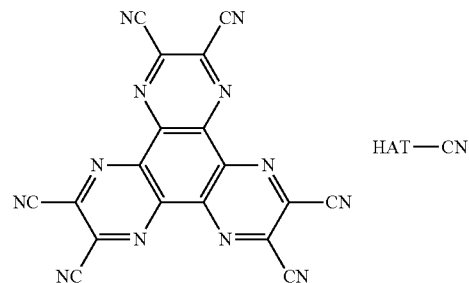

HAT—CN

[Eighth Chemical Formula]

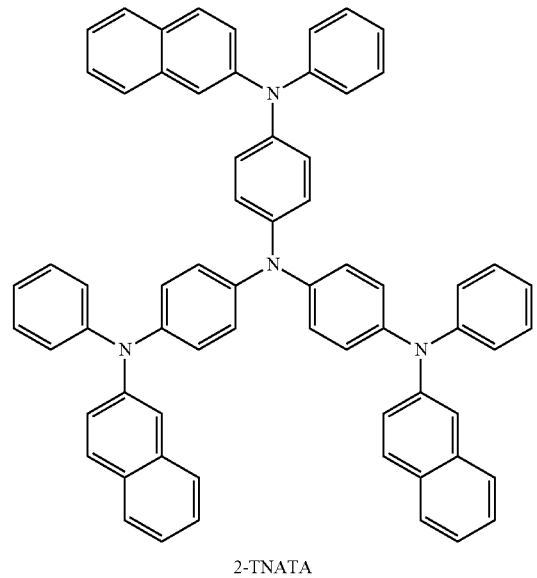 [SMILES: c1ccc(N(c2ccc(N(c3ccc(N(c4ccccc4)c4ccc5ccccc5c4)cc3)c3ccc(N(c4ccccc4)c4ccc5ccccc5c4)cc3)cc2)c2ccc3ccccc3c2)cc1]

2-TNATA

[Ninth Chemical Formula]

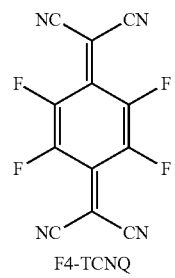

F4-TCNQ

[Tenth Chemical Formula]

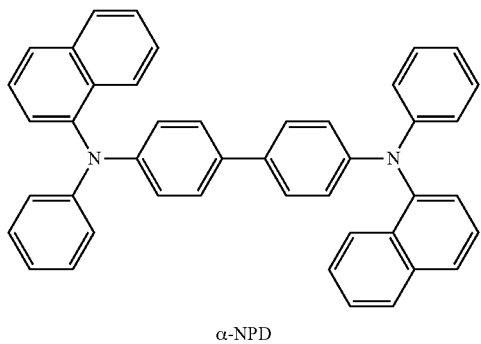 [SMILES: c1ccc(N(c2ccc(-c3ccc(N(c4ccccc4)c4cccc5ccccc45)cc3)cc2)c2cccc3ccccc23)cc1]

α-NPD

[Eleventh Chemical Formula]

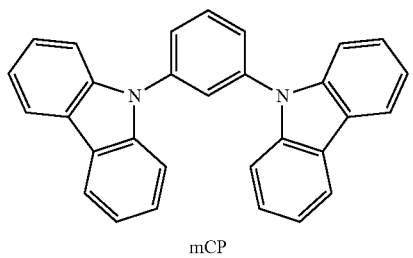 [SMILES: c1cc(-n2c3ccccc3c3ccccc32)cc(-n2c3ccccc3c3ccccc32)c1]

mCP

[Twelfth Chemical Formula]

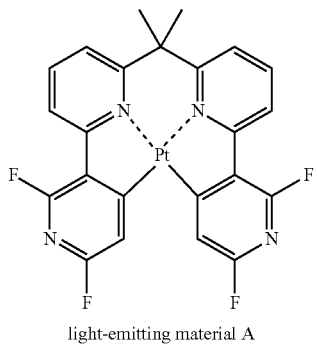

light-emitting material A

[Thirteenth Chemical Formula]

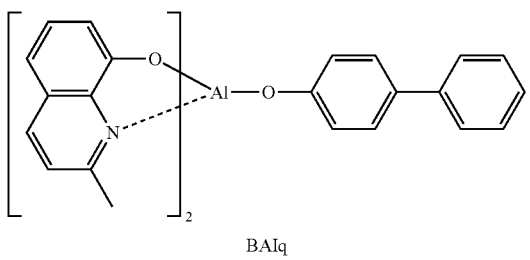

BAlq

—Production of Reflecting Electrode (Second Electrode)—

LiF (1 nm) and, as electrodes, aluminum (either 100 nm or 0.5 nm) and silver (100 nm) were applied by vapor deposition.

—Sealing—

The organic layer side of the substrate was sealed with a sealing glass can in which a desiccant was affixed in a nitrogen gas atmosphere, and the side where the substrate was installed was coated with a sealing material.

Working Example 1

The diffused conductive layer coating solution 1 was obtained by the aforementioned method using a conductive polymer (PEDOT-PSS), refractive index control particles (TiO$_2$), and light scattering particles (PMMA; primary particle size of 1.5 μm) in a volumetric ratio of 30:20:30.

The organic electroluminescent element of Working Example 1 was obtained by performing a glass substrate surface treatment, film formation of the diffused conductive layer 1 (first electrode), production of the organic EL layer, and production of the reflecting electrode (second electrode), and performing the aforementioned sealing.

FIG. 1 is a schematic diagram showing the configuration of the organic electroluminescent elements in Working Example 1 as well as Working Examples 4 and 9 to 11 and Comparative Examples 2, 6, and 7 described below.

The size of the emission face of the organic electroluminescent element was 10×10 mm.

Working Example 2

Figure 2:
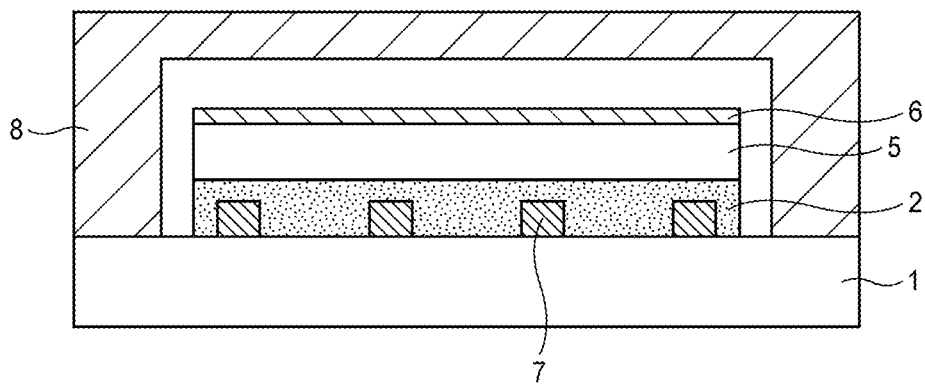
FIG. 2 is a schematic diagram showing the organic electroluminescent element in Working Example 2.

Other than installing auxiliary wiring on a glass substrate by photolithographic auxiliary wiring film formation and setting the size of the emission face of the organic electroluminescent element to 30×30 mm, the same operation as in Working Example 1 was performed to obtain the organic electroluminescent element of Working Example 2. A schematic diagram showing the configuration of the organic electroluminescent element in Working Example 2 is shown in FIG. 2.

Working Example 3

Figure 3:
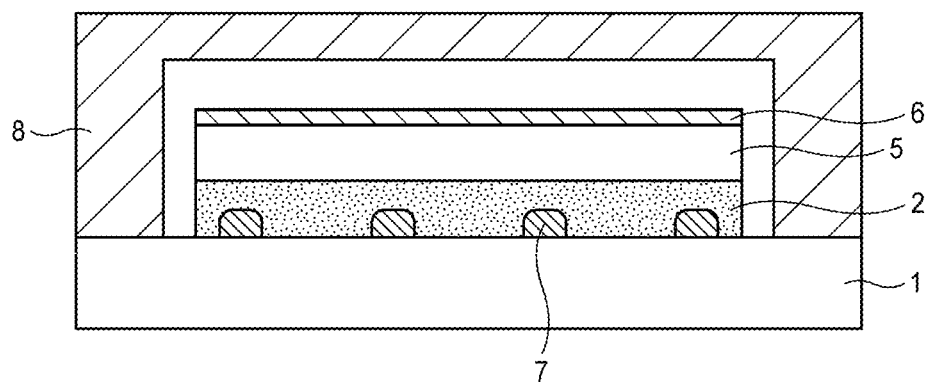
FIG. 3 is a schematic diagram showing the organic electroluminescent element in Working Example 3.

Other than installing auxiliary wiring on a glass substrate by mask auxiliary wiring film formation and setting the size of the emission face of the organic electroluminescent element to 30×30 mm, the same operation as in Working Example 1 was performed to obtain the organic electroluminescent element of Working Example 3. A schematic diagram showing the configuration of the organic electroluminescent element in Working Example 3 is shown in FIG. 3.

Working Example 4

Other than changing the light scattering particles with a primary particle size of 1.5 μm to light scattering particles with a primary particle size of 12 μm and changing the thickness of the coating-type diffused conductive layer to 12 μm, the same operation as in Working Example 1 was performed to obtain the organic electroluminescent element of Working Example 4.

Working Example 5

Figure 4:
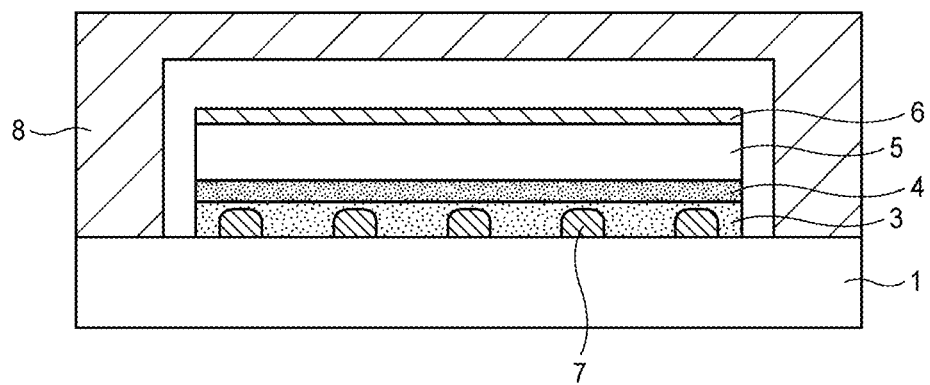
FIG. 4 is a schematic diagram showing the organic electroluminescent elements in Working Examples 5 to 8.

The diffused conductive layer coating solution 2 was produced using the material given in Table 1. Other than making the diffused conductive layer to a two-layer configuration of the diffused conductive layer 1 and the diffused conductive layer 2 and changing the reflecting electrode to aluminum/silver, the same operation as in Working Example 3 was performed to obtain the organic electroluminescent element of Working Example 5. FIG. 4 is a schematic diagram showing the configuration of the organic electroluminescent elements in Working Example 5 as well as Working Examples 6 to 8 described below.

Working Examples 6 to 8

Other than using the materials given in Table 1 to produce the diffused conductive layer coating solutions 1 and 2, the same operation as in Working Example 5 was performed to obtain the organic electroluminescent elements of Working Examples 6 to 8.

Working Example 9

Other than changing the light scattering particles used for the diffused conductive layer coating solution 1 from PMMA particles (with a primary particle size of 1.5 μm) to silica-melamine resin particles (with a primary particle size of 2.0 μm), the same operation as in Working Example 1 was performed to obtain the organic electroluminescent element of Working Example 9.

Working Example 10

Other than changing the refractive index control particles used for the diffused conductive layer coating solution 1 from titanium oxide (n=2.4) to zirconium oxide (n=2.4), the same operation as in Working Example 1 was performed to obtain the organic electroluminescent element of Working Example 10.

Working Example 11

Other than changing the refractive index control particles used for the diffused conductive layer coating solution 1 from titanium oxide (n=2.4) to zinc oxide (n=1.95) and readjusting the blend ratio, the same operation as in Working Example 1 was performed to obtain the organic electroluminescent element of Working Example 11.

Comparative Example 1

Figure 5:
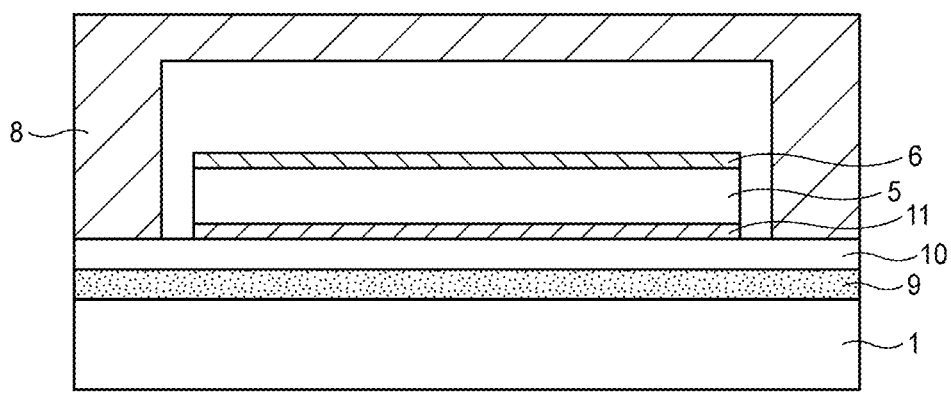
FIG. 5 is a schematic diagram showing the organic electroluminescent element in Comparative Example 1.

A coating material for the planarization layer and a coating material for the diffused layer were produced using the materials given in Table 2. Then, the organic electroluminescent element of Comparative Example 1 was obtained by performing a glass substrate surface treatment, production of the planarization layer and diffused layer, film formation of ITO (first electrode), production of the organic EL layer, and production of the reflecting electrode (second electrode), and performing sealing. FIG. 5 is a schematic diagram showing the configuration of the organic electroluminescent element of Comparative Example 1. The size of the emission face of the organic electroluminescent element was 10×10 mm.

Comparative Example 2

Other than changing the light scattering particles with a primary particle size of 1.5 μm to light scattering particles with a primary particle size of 0.3 μm, the same operation as in Working Example 1 was performed to obtain the organic electroluminescent element of Comparative Example 2.

Comparative Example 3

Figure 6:
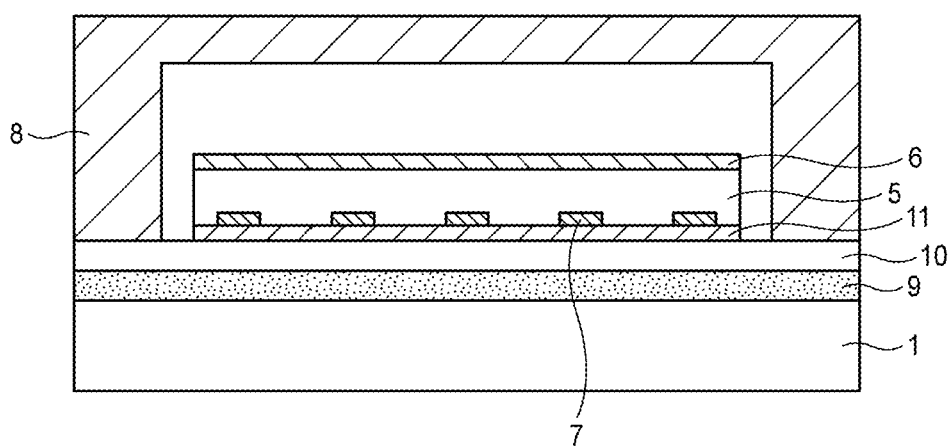
FIG. 6 is a schematic diagram showing the organic electroluminescent element in Comparative Example 3.

Other than installing auxiliary wiring on ITO by photolithographic auxiliary wiring film formation and setting the size of the emission face of the organic electroluminescent element to 30×30 mm, the same operation as in Comparative Example 1 was performed to obtain the organic electroluminescent element of Comparative Example 3. A schematic diagram showing the configuration of the organic electroluminescent element in Comparative Example 3 is shown in FIG. 6.

Comparative Example 4

Figure 7:
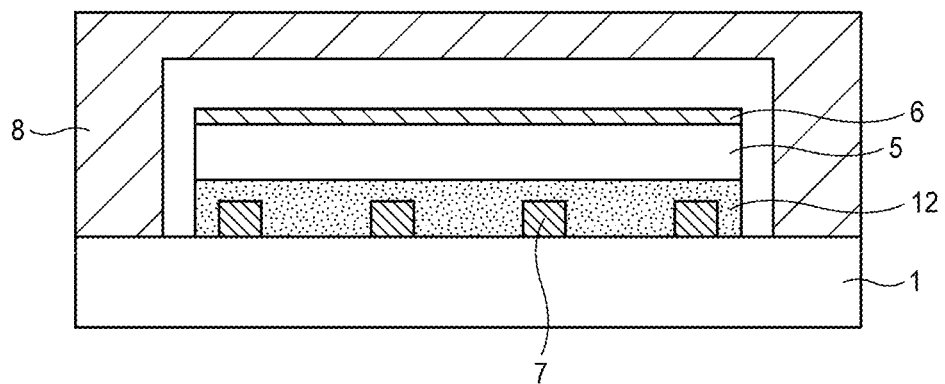
FIG. 7 is a schematic diagram showing the organic electroluminescent element in Comparative Example 4.

Other than using a coating-type diffused conductive layer that did not contain refractive index control particles, the same operation as in Working Example 2 was performed to obtain the organic electroluminescent element of Comparative Example 4. FIG. 7 is a schematic diagram showing the configuration of the organic electroluminescent element in Comparative Example 4.

Comparative Example 5

Figure 8:
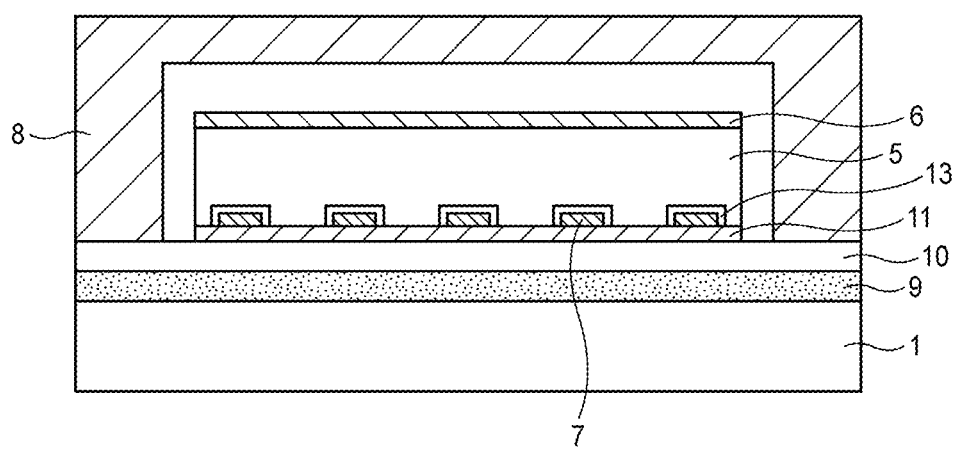
FIG. 8 is a schematic diagram showing the organic electroluminescent element in Comparative Example 5.

Other than forming auxiliary wiring on ITO by mask auxiliary wiring film formation, then coating the auxiliary wiring with a protective resist, and increasing the thickness of the hole injection layer, the same operation as in Comparative Example 3 was performed to obtain the organic electroluminescent element of Comparative Example 5. FIG. 8 is a schematic diagram showing the configuration of the organic electroluminescent element in Comparative Example 5.

Comparative Example 6

Other than using a conductive layer formed by removing the light scattering particles from the diffused conductive layer coating solution 1, the same operation as in Working Example 1 was performed to obtain the organic electroluminescent element of Comparative Example 6.

Comparative Example 7

Other than changing the refractive index control particles used for the diffused conductive layer coating solution 1 from titanium oxide (n=2.4) to aluminum oxide (alumina, n=1.8), the same operation as in Working Example 1 was performed to obtain the organic electroluminescent element of Comparative Example 7.

Comparative Example 0

Figure 9:
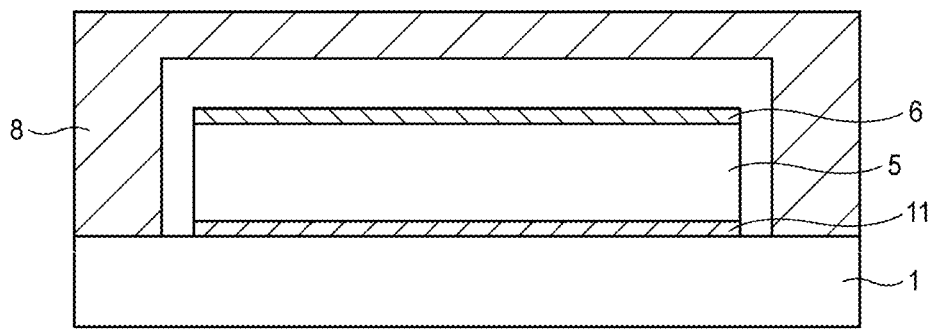
FIG. 9 is a schematic diagram showing the organic electroluminescent element in Comparative Example 0.

Other than forming a film of ITO directly on a glass substrate, the same operation as in Comparative Example 1 was performed to obtain the organic electroluminescent element of Comparative Example 0. FIG. 9 is a schematic diagram showing the configuration of the organic electroluminescent element in Comparative Example 0. The organic electroluminescent elements in two types were produced with the sizes of the emission face being 10×10 mm and 30×30 mm.

As discussed below, the light extraction efficiency of other organic electroluminescent devices was evaluated by using Comparative Example 0 as a standard (reference element).

The light extraction efficiency of the organic electroluminescent devices thus produced was evaluated as follows:

<Measurement of Light Extraction Efficiency>

Each of the organic electroluminescent elements was made to emit light by applying a constant DC current of 2.5 mA/cm², and the radiation strength was measured using a CS2000 spectrophotometer made by Konica Minolta, Inc.

Then, the light extraction efficiency of the aforementioned organic electroluminescent element was calculated from the following formula:

light extraction efficiency (times)=(radiation strength of organic electroluminescent element÷radiation strength of reference element)

The results are given in Tables 1 and 2 below.

TABLE 1

|  | Working Ex. 1 | Working Ex. 2 | Working Ex. 3 | Working Ex. 4 |
|---|---|---|---|---|
| Organic EL layer | yes (Al electrode) | yes (Al electrode) | yes (Al electrode) | yes (Al electrode) |
| Conductive layer | coating-type diffused conductive layer (PEDOT-PSS)/refractive index control particles (TiO$_2$)/light scattering particles (PMMA, primary particle size 1.5 μm) = 30/20/30 thickness: 5 μm refractive index: 1.80 | coating-type diffused conductive layer (PEDOT-PSS)/refractive index control particles (TiO$_2$)/light scattering particles (PMMA, primary particle size 1.5 μm) = 30/20/30 thickness: 5 μm refractive index: 1.80 | coating-type diffused conductive layer (PEDOT-PSS)/refractive index control particles (TiO$_2$)/light scattering particles (PMMA, primary particle size 1.5 μm) = 30/20/30 thickness: 5 μm refractive index: 1.80 | coating-type diffused conductive layer (PEDOT-PSS)/refractive index control particles (TiO$_2$)/light scattering particles (PMMA, primary particle size 12 μm) = 30/20/30 thickness: 12 μm refractive index: 1.80 |
| Auxiliary wiring | no | yes Ag (100 nm) formed by photolithography (squared cross section) | yes Ag (100 nm) formed by vapor deposition (not squared cross section) | no |
| Light extraction efficiency | 175% | 177% | 179% | 165% |

|  | Working Ex. 5 | Working Ex. 6 | Working Ex. 7 | Working Ex. 8 |
|---|---|---|---|---|
| Organic EL layer | yes (Al/Ag electrode) | yes (Al/Ag electrode) | yes (Al/Ag electrode) | yes (Al/Ag electrode) |
| Conductive layer | coating-type diffused conductive layer (two-layer configuration) First layer (substrate side) coating-type diffused conductive layer (PEDOT-PSS)/refractive index control particles (TiO$_2$)/light scattering particles (PMMA, primary particle size 1.5 μm) = 30/20/30 thickness: 5 μm refractive index: 1.80 Second layer (organic layer side) coating-type diffused conductive layer (PEDOT-PSS)/refractive index control particles (TiO$_2$) = 60/40 thickness: 2 μm refractive index: 1.80 | coating-type diffused conductive layer (two-layer configuration) First layer (substrate side) coating-type diffused conductive layer (PEDOT-PSS)/refractive index control particles (TiO$_2$)/light scattering particles (PMMA, primary particle size 1.5 μm) = 25/25/50 thickness: 5 μm refractive index: 1.85 Second layer (organic layer side) coating-type diffused conductive layer (PEDOT-PSS)/refractive index control particles (TiO$_2$) = 50/50 thickness: 2 μm refractive index: 1.85 | coating-type diffused conductive layer (two-layer configuration) First layer (substrate side) coating-type diffused conductive layer (PEDOT-PSS)/refractive index control particles (TiO$_2$)/light scattering particles (PMMA, primary particle size 1.5 μm) = 35/15/50 thickness: 5 μm refractive index: 1.75 Second layer (organic layer side) coating-type diffused conductive layer (PEDOT-PSS)/refractive index control particles (TiO$_2$) = 70/30 thickness: 2 μm refractive index: 1.75 | coating-type diffused conductive layer (two-layer configuration) First layer (substrate side) coating-type diffused conductive layer (PEDOT-PSS)/refractive index control particles (TiO$_2$)/light scattering particles (PMMA, primary particle size 1.5 μm) = 40/10/50 thickness: 5 μm refractive index: 1.70 Second layer (organic layer side) coating-type diffused conductive layer (PEDOT-PSS)/refractive index control particles (TiO$_2$) = 80/20 thickness: 2 μm refractive index: 1.70 |
| Auxiliary wiring | yes Ag (100 nm) formed by vapor deposition (not squared cross section) | yes Ag (100 nm) formed by vapor deposition (not squared cross section) | yes Ag (100 nm) formed by vapor deposition (not squared cross section) | yes Ag (100 nm) formed by vapor deposition (not squared cross section) |
| Light extraction efficiency | 205% | 198% | 193% | 185% |

TABLE 1-continued

|  | Working Ex. 9 | Working Ex. 10 | Working Ex. 11 |
|---|---|---|---|
| Organic EL layer | yes (Al electrode) | yes (Al electrode) | yes (Al electrode) |
| Conductive layer | coating-type diffused conductive layer (PEDOT-PSS)/ refractive index control particles (TiO$_2$)/light scattering particles (silica-melamine resin, primary particle size 2.0 μm) = 30/20/30 thickness: 5 μm refractive index: 1.80 | coating-type diffused conductive layer (PEDOT-PSS)/ refractive index control particles (ZrO)/light scattering particles (PMMA, primary particle size 1.5 μm) = 30/20/30 thickness: 5 μm refractive index: 1.80 | coating-type diffused conductive layer (PEDOT-PSS)/ refractive index control particles (ZnO)/light scattering particles (PMMA, primary particle size 1.5 μm) = 15/35/30 thickness: 5 μm refractive index: 1.80 |
| Auxiliary wiring | no | no | no |
| Light extraction efficiency | 172% | 175% | 168% |

TABLE 2

|  | Comparative Ex. 1 | Comparative Ex. 2 | Comparative Ex. 3 | Comparative Ex. 4 |
|---|---|---|---|---|
| Organic EL layer | yes (Al electrode) | yes (Al electrode) | yes (Al electrode) | yes (Al electrode) |
| Conductive layer | ITO (100 nm) (refractive index: 2.0) | coating-type diffused conductive layer (PEDOT-PSS)/ refractive index control particles (TiO$_2$)/light scattering particles (PMMA, primary particle size 0.3 μm) = 30/20/30 refractive index: 1.8 | ITO (100 nm) (refractive index: 2.0) | coating-type diffused conductive layer (PEDOT-PSS)/light scattering particles (PMMA) = 50/30 thickness: 5 μm refractive index: 1.5 |
| Auxiliary wiring | no | no | yes Ag (100 nm) formed by photolithography (squared cross section) | yes Ag (100 nm) formed by photolithography (squared cross section) |
| Planarization layer | refractive index control particles (TiO$_2$)/resin = 25/75 thickness: 6 μm refractive index: 1.756 | no | refractive index control particles (TiO$_2$)/resin = 25/75 thickness: 6 μm refractive index: 1.756 | no |
| Diffused layer | Material of above planarization layer/ light scattering particles (PMMA) = 50/50 thickness: 5 μm | no | Material of above planarization layer/ light scattering particles (PMMA) = 50/50 thickness: 5 μm | no |
| Light extraction efficiency | 143% | 155% | 110% | 157% |

|  | Comparative Ex. 5 | Comparative Ex. 6 | Comparative Ex. 7 | Comparative Ex. 0 |
|---|---|---|---|---|
| Organic EL layer | yes (HIL layer*[1] thickness increase) (Al electrode) | yes (Al electrode) | yes (Al electrode) | yes (Al electrode) |
| Conductive layer | ITO (100 nm) (refractive index: 2.0) | coating-type diffused conductive layer (PEDOT-PSS)/ refractive index control particles (TiO$_2$) = 30/20 thickness: 5 μm refractive index: 1.80 | coating-type diffused conductive layer (PEDOT-PSS)/ refractive index control particles (Al$_2$O$_3$)/light scattering particles (PMMA, primary particle size 1.5 μm) = 30/20/30 thickness: 5 μm refractive index: 1.58 | ITO (100 nm) (refractive index: 2.0) |

TABLE 2-continued

| | | | | |
|---|---|---|---|---|
| Auxiliary wiring | yes<br>Ag (100 nm)<br>(resist protected over ITO) | no | no | no |
| Planarization layer | refractive index control particles (TiO$_2$)/resin = 25/75<br>thickness: 6 μm<br>refractive index: 1.756 | no | no | no |
| Diffused layer | Above material/light scattering particles (PMMA) = 50/50<br>thickness: 5 μm | no | no | no |
| Light extraction efficiency | 157% | 158% | 158% | 100% (standard) |

*[1]HIL layer: hole injection layer

It was found from the results in Tables 1 and 2 that each of the organic electroluminescent elements of Working Examples 1 to 11 had high light extraction efficiency.

It was found from Working Example 4 that when the primary particle size of the light scattering particles used in the conductive layer of the present invention is within the range of 0.5 to 10 μm, there will be a good balance between forward and rearward scattering, and good diffusion efficiency will be obtained, and consequently high light extraction efficiency is obtained.

It was found from Working Examples 5 to 8 that when the conductive layer of the present invention is configured from two layers, there is better flatness of the face on which the organic layer is formed, which contributes to better performance of an organic electroluminescent element that is susceptible to the effect of unevenness of the film formation face, and consequently high light extraction efficiency is obtained.

The organic electroluminescent element of Working Example 11 is an element in which refractive index control particles (ZnO) with a refractive index of less than 2.0 were used. In this case, the amount in which ZnO needs to be added to increase the refractive index of the conductive layer is greater than when using TiO$_2$ or ZrO as the refractive index control particles. As a result, with the organic electroluminescent element of Working Example 11, there is more scattering caused by the ZnO added to the conductive layer, and there is also more rearward scattering in the conductive layer, and a slight decrease in light extraction efficiency is noted as compared to Working Examples 1, 9, and 10.

In the organic electroluminescent element of Comparative Example 1, ITO containing no light scattering particles is used as the transparent electrode, and the light scattering particles are contained in the planarization layer. It is thought that this element has unevenness in the planarization layer, and a decrease in light extraction efficiency attributable to electrical leakage caused by the unevenness was noted.

In the organic electroluminescent element of Comparative Example 2, there was noted a decrease in light extraction efficiency attributable to the fact that the primary particle size of the light scattering particles contained in the conductive layer was only 0.3 μm.

In the organic electroluminescent element of Comparative Example 3, there was noted a further decrease in extraction efficiency attributable to the fact that the electrical leakage caused by unevenness in Comparative Example 1 was exacerbated by auxiliary wiring.

In the organic electroluminescent elements of Comparative Examples 4 and 7, there was noted a decrease in light extraction efficiency attributable to the fact that the refractive index of the conductive layer was lower than that of the organic light-emitting layer.

In the organic electroluminescent element of Comparative Example 5, there was noted a decrease in light extraction efficiency attributable to the fact that the auxiliary wiring was coated with a resist, which increased the thickness of the hole injection layer.

In the organic electroluminescent element of Comparative Example 6, there was noted a decrease in light extraction efficiency attributable to the fact that the conductive layer contained no light scattering particles, and the ability of the conductive layer to convert the optical angle was extremely low.

INDUSTRIAL APPLICABILITY

The organic electroluminescent element of the present invention can be used favorably in a variety of fields, such as various kinds of lighting, computers, onboard displays, outdoor displays, household devices, commercial devices, consumer devices, traffic displays, clock and watch displays, calendar displays, luminescent screens, and acoustic devices.

DESCRIPTION OF SYMBOLS 1 glass substrate
2 coating-type diffused conductive layer
3 coating-type diffused conductive layer 1
4 coating-type diffused conductive layer 2
5 organic layer
6 reflecting electrode
7 auxiliary wiring
8 sealing can
9 diffused layer
10 planarization layer
11 transparent electrode (ITO)
12 coating-type conductive layer (containing no refractive index control particles)
13 resist

The invention claimed is:
1. An organic electroluminescent element in which a substrate, a first electrode adjacent to this substrate, an organic layer including at least one organic light-emitting layer, and a second electrode adjacent to this organic layer are formed in this order, wherein
at least one of said electrodes is a transparent electrode, which contains at least one type of light scattering particles that are transparent and have a primary particle size of at least 0.5 μm, and which is composed of said light scattering particles and a component having a refractive index equal to or higher than the refractive index of said organic light-emitting layer.

2. The organic electroluminescent element according to claim 1, wherein the component having a refractive index equal to or higher than the refractive index of said organic light-emitting layer contains particles with a primary particle size of 100 nm or less.

3. The organic electroluminescent element according to claim 2, wherein the refractive index of said particles whose primary particle size is 100 nm or less is at least 2.0 and no more than 3.0.

4. The organic electroluminescent element according to claim 1, wherein the component having a refractive index equal to or higher than the refractive index of said organic light-emitting layer contains a conductive matrix.

5. The organic electroluminescent element according to claim 4, wherein the component having a refractive index equal to or higher than the refractive index of said organic light-emitting layer contains a conductive matrix and particles whose primary particle size is 100 nm or less, and the refractive index of said particles whose primary particle size is 100 nm or less is higher than the refractive index of the conductive matrix.

6. The organic electroluminescent element according to claim 1, wherein the refractive index of the component having a refractive index equal to or higher than the refractive index of said organic light-emitting layer is at least 1.7 and no more than 2.2.

7. The organic electroluminescent element according to claim 1, wherein the primary particle size of said light scattering particles is at least 0.5 μm and no more than 10 μm.

8. The organic electroluminescent element according to claim 1, wherein the refractive index of said light scattering particles is lower than the refractive index of the component having a refractive index equal to or higher than the refractive index of said organic light-emitting layer.

9. An organic electroluminescent element in which a substrate, a first electrode adjacent to this substrate, an organic layer including at least one organic light-emitting layer, and a second electrode in direct contact with this organic layer are formed in this order, wherein at least one of said electrodes is a transparent electrode configured from two layers, these two layers both contain a conductive matrix, one of said two layers contains at least one type of light scattering particles that are transparent and have a primary particle size of at least 0.5 μm and is composed of said light scattering particles and a component having a refractive index equal to or higher than the refractive index of said organic light-emitting layer, and the other layer does not contain light scattering particles and has a refractive index that is equal to or higher than the refractive index of the organic light-emitting layer.

10. The organic electroluminescent element according to claim 9, wherein of said two layers, the layer that does not contain light scattering particles is adjacent to the organic layer.

11. The organic electroluminescent element according to claim 1, wherein either said first electrode or second electrode is a transparent electrode, and the other electrode is a metal electrode.

12. The organic electroluminescent element according to claim 1, wherein said first electrode is a transparent electrode.

13. The organic electroluminescent element according to claim 1, wherein wiring whose resistance is lower than that of said first electrode is provided between said first electrode and substrate, and said first electrode covers said wiring.

* * * * *